US007145213B1

(12) United States Patent
Ebel et al.

(10) Patent No.: US 7,145,213 B1

(45) Date of Patent: Dec. 5, 2006

(54) MEMS RF SWITCH INTEGRATED PROCESS

(75) Inventors: John L. Ebel, Beavercreek, OH (US); Rebecca Cortez, Xenia, OH (US); Richard E. Strawser, Greenville, OH (US); Kevin D. Leedy, Centerville, OH (US)

(73) Assignee: The United States of America as represented by the Secretary of the Air Force, Washington, DC (US)

( * ) Notice: Subject to any disclaimer, the term of this patent is extended or adjusted under 35 U.S.C. 154(b) by 0 days.

(21) Appl. No.: 10/901,314

(22) Filed: Jul. 27, 2004

Related U.S. Application Data

(60) Provisional application No. 60/573,892, filed on May 24, 2004.

(51) Int. Cl.
*H01L 21/14* (2006.01)

(52) U.S. Cl. ...................................... 257/414; 257/433

(58) Field of Classification Search ................. 438/48; 257/217–234, 252–254, 414–420, 428, 431, 257/433
See application file for complete search history.

(56) References Cited

U.S. PATENT DOCUMENTS

| | | | | |
|---|---|---|---|---|
| 5,090,254 | A | 2/1992 | Guckel et al. | |
| 5,589,082 | A | 12/1996 | Lin et al. | |
| 6,118,164 | A | 9/2000 | Seefeldt et al. | |
| 6,444,135 | B1 | 9/2002 | Hanabe et al. | |
| 6,452,124 | B1 * | 9/2002 | York et al. | 200/181 |
| 6,452,238 | B1 | 9/2002 | Orcutt et al. | |
| 6,472,739 | B1 | 10/2002 | Wood et al. | |
| 6,525,396 | B1 * | 2/2003 | Melendez et al. | 257/528 |
| 6,621,387 | B1 | 9/2003 | Hopcroft | |
| 6,635,509 | B1 | 10/2003 | Ouellet | |
| 6,635,919 | B1 * | 10/2003 | Melendez et al. | 257/312 |
| 6,673,697 | B1 | 1/2004 | Ma et al. | |
| 6,686,820 | B1 | 2/2004 | Ma et al. | |
| 2003/0047533 | A1 | 3/2003 | Reid et al. | |
| 2003/0155643 | A1 * | 8/2003 | Friedhoff | 257/704 |

OTHER PUBLICATIONS

E.R. Brown, "RF-MEMS Switches for Reconfigurable Integrated Circuits", IEEE Trans. on Microwave Theory and Techniques, Nov. 1998, pp. 1868-1880, vol. 46, No. 11.

(Continued)

*Primary Examiner*—Brook Kebede
(74) *Attorney, Agent, or Firm*—AFMCLO/JAZ; Gerald B. Hollins

(57) ABSTRACT

A capacitance coupled, transmission line-fed, radio frequency MEMS switch and its fabrication process using photoresist and other low temperature processing steps are described. The achieved switch is disposed in a low cost dielectric housing free of undesired electrical effects on the switch and on the transmission line(s) coupling the switch to an electrical circuit. The dielectric housing is provided with an array of sealable apertures useful for wet, but hydrofluoric acid-free, removal of switch fabrication employed materials and also useful during processing for controlling the operating atmosphere surrounding the switch—e.g. at a pressure above the high vacuum level for enhanced switch damping during operation. Alternative arrangements for sealing an array of dielectric housing apertures are included. Processing details including plan and profile drawing views, specific equipment and materials identifications, temperatures and times are also disclosed.

19 Claims, 27 Drawing Sheets

OTHER PUBLICATIONS

J. Lee et al., "Monolithic 2-18 GHz Low Loss, On-Chip Biased PIN Diode Switches", IEEE Trans. on Microwave Theory an dTechniques, Feb. 1995, pp. 250-255, vol. 43.

V.J. Kapoor, "InGaAs Microwave Switch Transistors for Phase Shifter Circuits", IEEE Trans. on Microwave Theory and Techniques, May 1994, pp. 772-778, vol. 42.

K. Leedy et al, "Metallization Schemes for RF MEMS Switches", J. Vacuum Science Technology, Jul./Aug. 2003, pp. 1172-1177, vol. A 21(4).

H. Elderstig and P. Wallgren, "Spin Depositioin of Polymers over Holes and Cavities", Sensors and Actuators, 1995, pp. 95-97, vol. A 46—46.

M. Madou, *Fundamentals of Microfabrication*, 1997, p. 378, CRC Press, Boca Raton, Florida.

* cited by examiner

MEMS RF SWITCH INTEGRATED PROCESS

CLAIM OF PRIORITY

This application claims the benefit of U.S. Provisional Application No. 60/573,892 filed May 24, 2004. The contents of this provisional application are hereby incorporated by reference herein.

RIGHTS OF THE GOVERNMENT

The invention described herein may be manufactured and used by or for the Government of the United States for all governmental purposes without the payment of any royalty.

CROSS REFERENCE TO RELATED PATENT DOCUMENT

The present document is related to the copending and commonly assigned patent application document "MEMS RF SWITCH INTEGRATED PROCESS", AFD 685, Ser. No. 10/901,315 filed of even date herewith. The contents of this related even filing date document are hereby incorporated by reference herein.

BACKGROUND OF THE INVENTION

MEMS technology has numerous applications in both commercial and military electrical systems. MEMS switches, for instance, can be used in routing radio frequency and microwave frequency signals in high frequency circuits. Some advantages of MEMS switches used in this manner over other active devices such as field effect transistors (FETS) and positive intrinsic negative (PIN) diodes include lower signal loss, higher signal isolation, and lower power consumption for switch activation (In this regard see for example E. R. Brown, "RF-MEMS Switches for Reconfigurable Integrated Circuits," *IEEE Trans. On Microwave Theory and Techniques*, Vol. 46, No. 11, November 1998, p. 1868–1880; J. Lee, et al. "Monolithic 2–18 GHz Low Loss, On-Chip Biased PIN Diode Switches," *IEEE Trans. On Microwave Theory and Techniques*, Vol. 43, February 1995, p. 250–255; M. Shokrani and V. J. Kapoor, "InGaAs Microwave Switch Transistors for Phase Shifter Circuits," *IEEE Trans. On Microwave Theory and Techniques*, Vol. 42, May 1994, p. 772–778.)

A MEMS package ideally should be economical in materials cost, space requirements, and incorporation technique. A MEMS packaging arrangement should protect the enclosed switch from structural damage and contaminants, allow handling, conform to the RF requirements of the host system, be low cost, and not impede the performance of the switch or circuit. Some estimates attribute more than 70% of overall device costs to packaging (See for example M. Madou, *Fundamentals of Microfabrication*, CRC Press, Boca Raton, Fla., 1997, p. 378).

Several approaches exist for packaging MEMS switches. The "chip-in-a-box" approach entails dicing of un-released switch wafers, die attachment, interconnection, switch release, and lid seal. This process requires die level handling and release of switches inside the packages. A second approach is a wafer bonding arrangement that requires a capping wafer and a bonding ring around the switch (see e.g., U.S. Pat. No. 6,452,238, J. W. Orcutt, et al., "MEMS Wafer Level Package," Sep. 17, 2002). Bonding arrangements may incorporate solder, eutectic, and epoxy materials. These arrangements involve low temperature processes and may result in a high aspect ratio device due to the combined thickness of the switch and the capping wafer.

The on-wafer fabrication and packaging approach of the present invention encapsulates the switches during the fabrication process, thus eliminating die handling issues and bonding ring requirements. In principle, the encapsulation of the present invention is similar to transistor passivation and requires no additional footprint or special wafer handling. The present invention-encapsulated switches may be diced, integrated and packaged along with other circuits of the system. The encapsulation approach is scalable to any size wafer.

The U.S. Pat. No. 5,589,082 of Liwei Lin et al. discloses a MEMS device of the electromechanical filter type that appears of interest with respect to the present invention. In FIGS. 7Q, 7R and 7S of the Lin et al. patent there is shown a sequence of three fabrication views for a filter in which capping, releasing and sealing of the MEMS enclosure are accomplished. Although several aspects of this capping, releasing and sealing sequence may appear closely related to the present invention it is interesting to note distinctions in at least the fabrication materials used, the fabrication temperatures used and the ambient pressure established in the completed MEMS enclosure.

The U.S. Pat. No. 5,589,082 of Qing Ma et al. discloses an assemblage of semiconductor components into a solder-seal-ring-closed package. These components include film bulk acoustic resonators and MEMS switches. The emphasis of the Ma et al. disclosure centers around packaging semiconductor devices (referred to as microelectromechanical systems) by solder sealing two separate structures along a sealing ring extending around a cavity containing the microelectromechanical system. Ma et al. also teach use of surface mount techniques, including application of solder bumps to package the electrical components. Interconnection to the cavity is through via holes in the thinned Ma et al. wafer. The present invention however includes packaging of individual RF MEMS switches using a wafer scale approach built on surface micromachining procedures consistent with the fabrication of MEMS switches. No change in a normal fabrication technique is needed for the present invention. The present invention also does not require the use of vias or wafer thinning.

SUMMARY OF THE INVENTION

The present invention provides an integrated multi-step wafer-scale fabrication and packaging process for realizing individual RF MEMS switches. The packaging is directly integrated into the switch surface micromachining process used to build the RF MEMS switch. The achieved packaging is compatible with both capacitive and metal-to-metal contact switches.

It is therefore an object of the present invention to provide an encapsulated MEMS switch process.

It is another object of the invention to provide an encapsulated MEMS switch process allowing for post processing operations such as wafer dicing, die pick-and-place, and die attach.

It is another object of the invention to provide a MEMS processing arrangement inclusive of the three major portions of switch fabrication, dielectric switch encapsulation and package sealing using a liquid phase sequence.

It is another object of the invention to provide a MEMS switch packaging arrangement that is usable with either a metal-to-metal contact or a capacitive coupled switch arrangement.

It is another object of the invention to provide a MEMS switch packaging arrangement inclusive of a new encapsulation attachment materials combination.

It is another object of the invention to provide a MEMS switch packaging arrangement in which the environment within the MEMS enclosure can be freely selected to be that most favorable for switch operation.

It is another object of the invention to provide a MEMS switch process in which switch fabrication and frozen switch capping can be achieved in a single sequence.

It is another object of the invention to provide a MEMS switch in which switch package sealing can be accomplished by a plurality of different arrangements.

It is another object of the invention to provide a MEMS switch packaging process employing relatively low temperature materials, materials having processing temperatures compatible with the MEMS switch.

It is another object of the invention to provide a MEMS switch fabrication and packaging process in which temperatures not exceeding 270° C. are used.

SUMMARY OF THE INVENTION

The present invention provides an integrated multi-step wafer-scale fabrication and packaging process for realizing individual RF MEMS switches. The packaging is directly integrated into the switch surface micromachining process used to build the RF MEMS switch. The achieved packaging is compatible with both capacitive and metal-to-metal contact switches.

It is therefore an object of the present invention to provide an encapsulated MEMS switch process.

It is another object of the invention to provide an encapsulated MEMS switch process allowing for post processing operations such as wafer dicing, die pick-and-place, and die attach.

It is another object of the invention to provide a MEMS processing arrangement inclusive of the three major portions of switch fabrication, dielectric switch encapsulation and package sealing using a liquid or gaseous phase sequence.

It is another object of the invention to provide a MEMS switch packaging arrangement that is usable with either a metal-to-metal contact or a capacitive coupled switch arrangement.

It is another object of the invention to provide a MEMS switch packaging arrangement inclusive of a new encapsulation attachment materials combination.

It is another object of the invention to provide a MEMS switch packaging arrangement in which the environment within the MEMS enclosure can be freely selected to be that most favorable for switch operation.

It is another object of the invention to provide a MEMS switch process in which switch fabrication and frozen switch capping can be achieved in a single sequence.

It is another object of the invention to provide a MEMS switch in which switch package sealing can be accomplished by a plurality of different arrangements.

It is another object of the invention to provide a MEMS switch packaging process employing relatively low temperature materials, materials having processing temperatures compatible with the MEMS switch.

It is another object of the invention to provide a MEMS switch fabrication and packaging process in which temperatures not exceeding 270° C. are used.

It is another object of the invention to provide a MEMS switch enclosure process in which dielectric materials are used in order to avoid signal transmission line perturbations attending metallic material enclosures.

It is another object of the invention to provide a MEMS switch enclosure process in which internal pressures above vacuum level are achievable in order to provide permanent physical damping for moving switch components.

These and other objects of the invention will become apparent as the description of the representative embodiments proceeds.

These and other objects of the invention are achieved by the limited temperature organic photoresist coating materials based MEMS switch realization method comprising the steps of:

fabricating metallic elements of said switch in a sequence of photoresist coating, masking, exposing and etching steps ending with MEMS switch elements being held captive on an insulating substrate in a sacrificial layer of said photoresist coating materials;

enclosing said captive switch elements in a dielectric shell using additional of said photoresist coating, masking, exposing and etching steps compatible with both said fabricating step photoresist coating, masking, exposing and etching steps and with structure formed during said fabricating step photoresist coating, masking, exposing and etching steps;

said enclosing step including forming in said dielectric shell a plurality of apertures communicating from outside to inside thereof, wet releasing said switch elements from captivity within said dielectric shell by said sacrificial layer of said photoresist coating materials by way of reagent received through said plurality of apertures communicating from outside to inside of said dielectric shell;

covering said plurality of apertures communicating from outside to inside of said dielectric shell with a coating material temperature compatible with said switch elements and with said dielectric shell.

BRIEF DESCRIPTION OF THE DRAWINGS

The accompanying drawings incorporated in and forming a part of the specification, illustrate several aspects of the present invention and together with the description serve to explain the principles of the invention. In the drawings.

DETAILED DESCRIPTION OF THE INVENTION

Figure 1A:
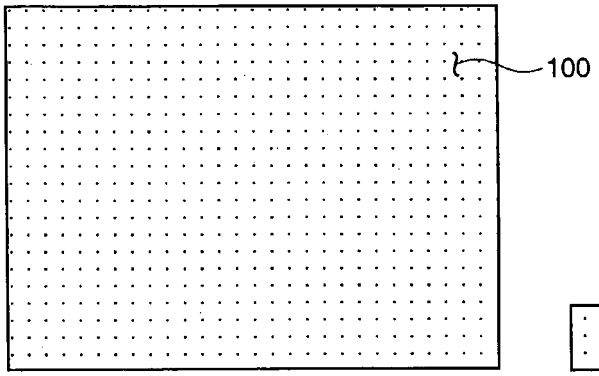
FIG. 1 in the drawings includes the views of FIG. 1A through FIG. 1P and shows a lower layer metal fabrication sequence for a MEMS switch according to the present invention.

The following detailed description of the invention is divided according to the major steps in fabricating a MEMS radio frequency switch device according to the invention. These major steps are generally identified as switch metal fabrication, dielectric switch encapsulation and switch sealing using a liquid or gaseous phase sequence Notwithstanding a division into these major steps in the description, this process at least through FIG. 6, may be viewed as a unitary sequence with the processing step headings disregarded. Alternatives and other details appear in the drawings subsequent to FIG. 6. The process described herein accomplishes a capacitance operated MEMS switch; the process is however equally relevant to a metal contact switch.

RF Metal Process

RF metal defines the bottom contact in a capacitive switch arrangement according to the invention. The metal thickness used determines the power handling capability of the switch. High power switches require thick metal (greater than 1 micrometer) that in turn requires planarization processing. Fabrication of an RF metal layer is preferably accomplished according to the steps represented in the FIG. 1 drawing, including the steps of FIG. 1A through FIG. 1P. In this FIG. 1 drawing and each other FIG. 1 through FIG. 9 drawing herein the left hand or odd-lettered steps represent a top view of the work piece and the right hand or even-lettered steps a side or profile view.

By way of explanation, in the following each step in this description includes one or more references to a drawing FIG. This FIG. reference in most instances also includes use of a identifier having a numerical value in accordance with the drawing number involved—including a hundreds digit corresponding to the drawing number (e.g. the numerical identifier 802 appears in an individual of FIG. 8, i.e., in FIG. 8D).

The MEMS switch fabrication sequence may include the following steps.

Figure 1B:
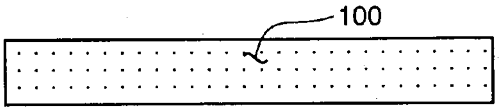
Figure 1C:
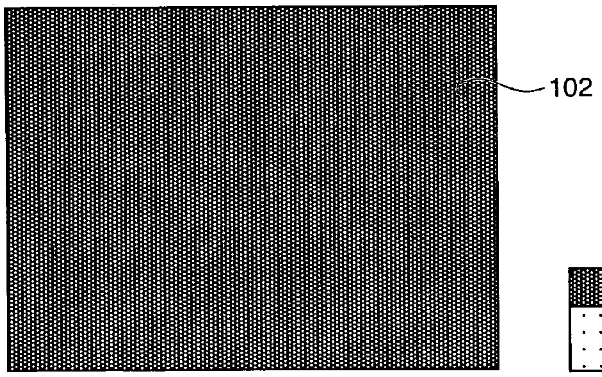
Figure 1D:
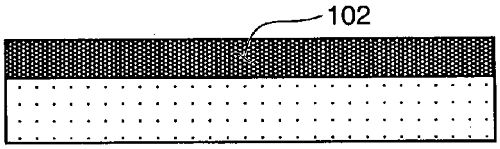

Fabrication begins in FIG. 1A, and 1B with a bare high resistivity wafer substrate 100, such as sapphire.

Spin coat the wafer substrate 100 with one coat of a photo-imagable PolydiMethylGlutarImide (PMGI) polymer photoresist 102 such as Micro Chem Corp. NANO PMGI SF-11 photoresist, FIGS. 1C and 1D, cure at 270° C. on a hot plate or in an oven.

Figure 1E:
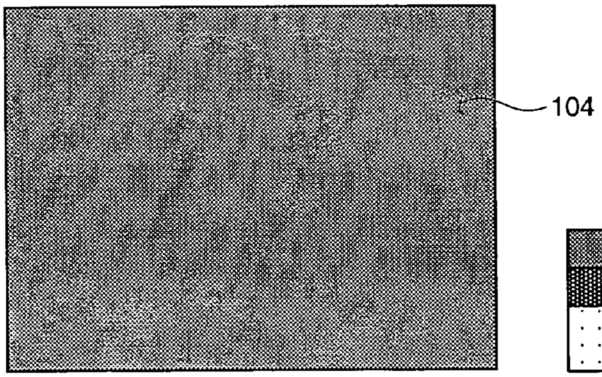
Figure 1F:
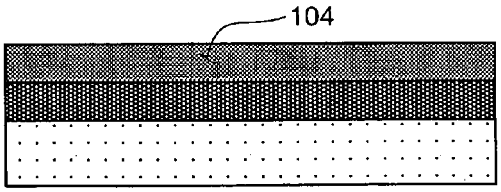

Spin coat the wafer substrate with one coat of a photo-imagable positive photoresist such as Shipley Microposit S-1813 photoresist 104, FIGS. 1E and 1F, cure at 110° C. on a hot plate or in an oven.

Figure 1G:
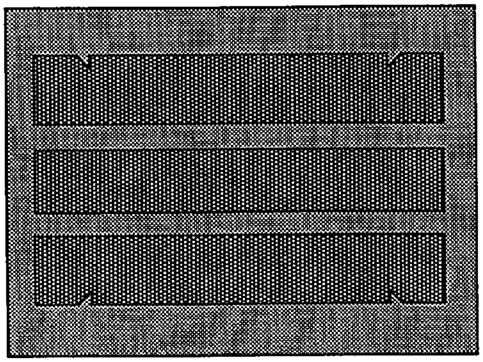
Figure 1H:
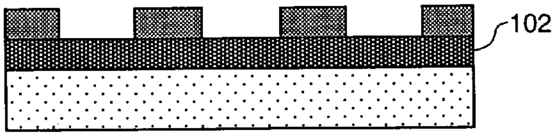
Figure 1I:
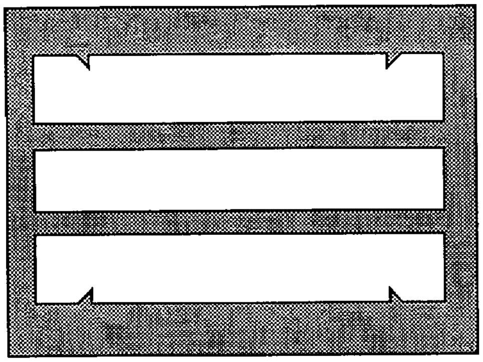
Figure 1J:
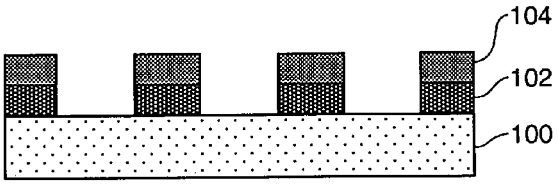
Figure 1K:
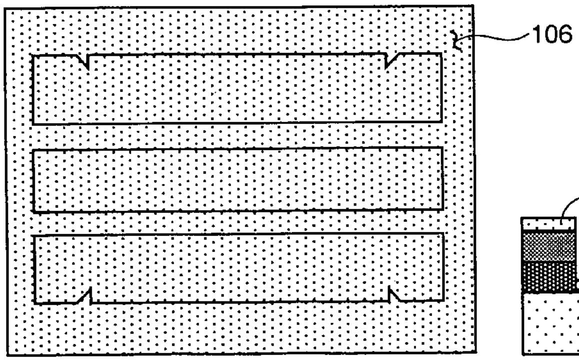
Figure 1L:
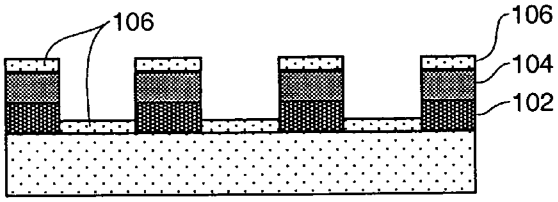

Using an I-line stepper or contact lithography system, expose the coated wafer substrate 100 to an appropriate RF Metal mask and develop the S-1813 resist 104 using a diluted sodium hydroxide based developer such as Shipley Microposit 351 developer, FIGS. 1G and 1H.

Expose the patterned wafer substrate 100 to Deep Ultra Violet (DUV) light and develop the SF-11 resist 102 using a tetraethylammonium hydroxide solution such as Micro Chem Corp. Nano-PMGI 101 developer, FIGS. 1I and 1J.

Coat the wafer substrate 100 with evaporated metal such as titanium/gold (TiAu), 200 Å Ti/3000 Å Au 106. The titanium is used as an adhesion layer and could be replaced with chromium (Cr), FIGS. 1K and 1L. The gold is used as the conduction layer.

Figure 1M:
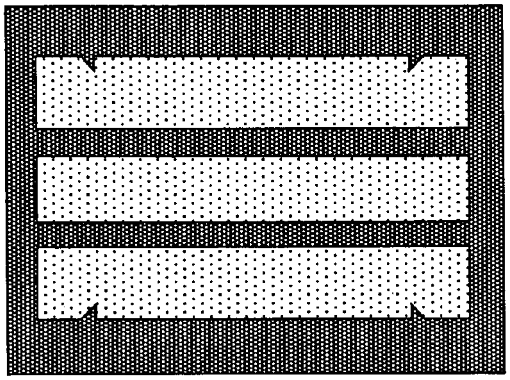
Figure 1N:
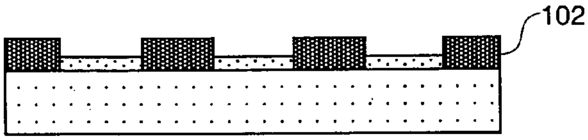

Lift-off the excess metal using tape and dissolve the S-1813 resist 104 using acetone, followed by an isopropyl alcohol rinse and De-Ionized (DI) water rinse, FIGS. 1M and 1N. The DI water rinse is desirable to minimize cracking of the PMGI photoresist 102.

Figure 1O:
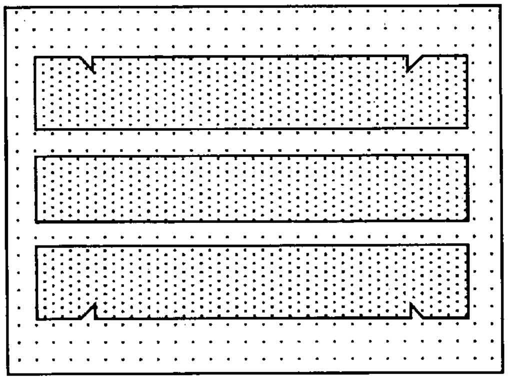
Figure 1P:
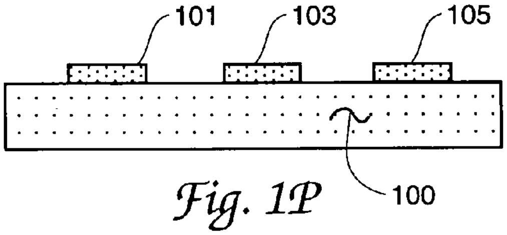

Strip the SF-11 photo resist 102 using a hot (90° C.) 1-methyl-2-pyrrolidinone stripper such as Shipley 1165 remover, followed by a De-Ionized (DI) water rinse and nitrogen dry, FIGS. 1O and 1P. For thicker metal, omit the SF-11 strip to achieve the thick metal planarization described in the initial sentences of the RF Metal process. The completed RF metal step is shown in FIG. 1O and FIG. 1P and includes the isolated conductors 101, 103 and 105.

RF Dielectric Process

The RF dielectric defines the capacitance of the switch in the "closed"-state. Processing steps involving the RF dielectric appear in the FIG. 2 drawings including the steps shown in FIG. 2A through FIG. 2P.

Figure 2A:
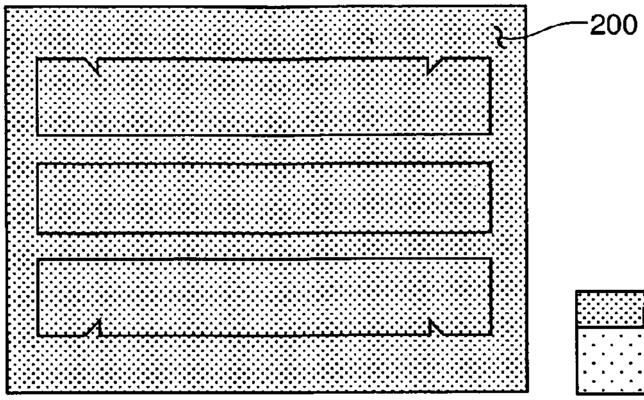
FIG. 2 in the drawings includes the views of FIG. 2A through FIG. 2P and shows a radio frequency dielectric fabrication sequence for a MEMS switch according to the present invention.
Figure 2B:
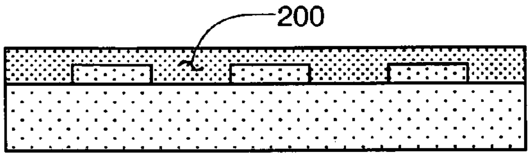

Coat the FIG. 1O and FIG. 1P metallized wafer 100 with a thin dielectric material such as 2000 Å alumina $Al_2O_3$ 200 using RF sputtering, FIG. 2A and FIG. 2B. Alternative dielectrics include silicon nitride $Si_3N_4$ and silicon dioxide $SiO_2$.

Figure 2C:
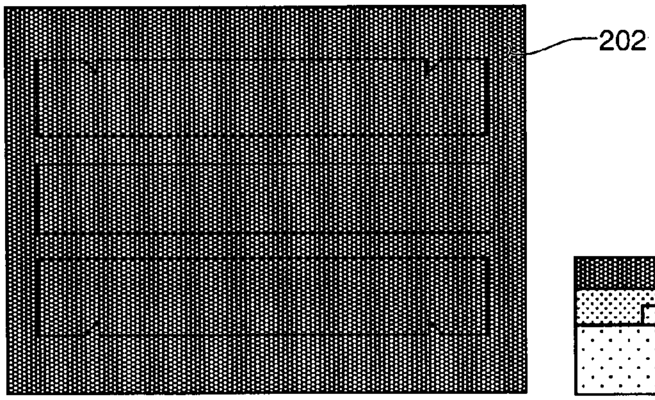
Figure 2D:
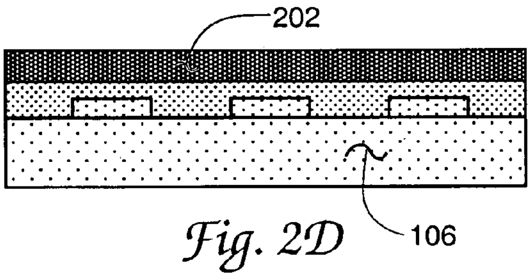

Spin coat the wafer with one coat PMGI photoresist (SF-11) 202, cure at 270° C., FIG. 2C and FIG. 2D. This step is also omitted for the thick metal planarization option.

Figure 2E:
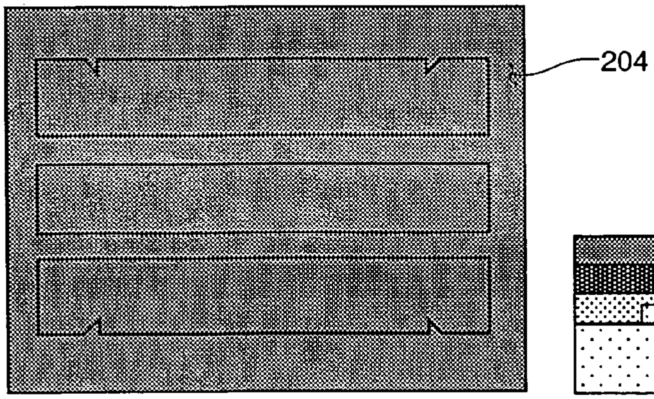
Figure 2F:
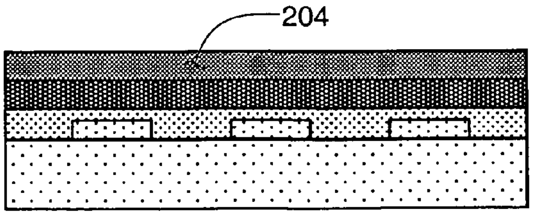

Spin coat the wafer with one coat of positive photoresist (S-1813) 204, cure at 110° C., FIG. 2E and FIG. 2F.

Figure 2G:
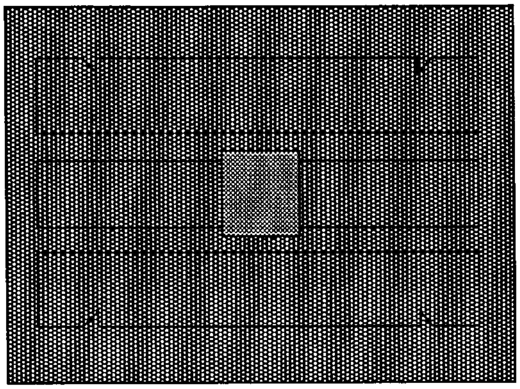
Figure 2H:
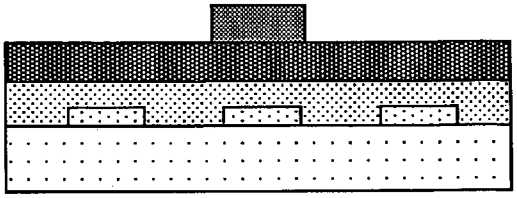

Using an I-line stepper or contact lithography system, expose the coated wafer to an appropriate RF Dielectric mask and develop the S-1813 resist 204 using a diluted developer (351:DI), FIG. 2G and FIG. 2H.

Figure 2I:
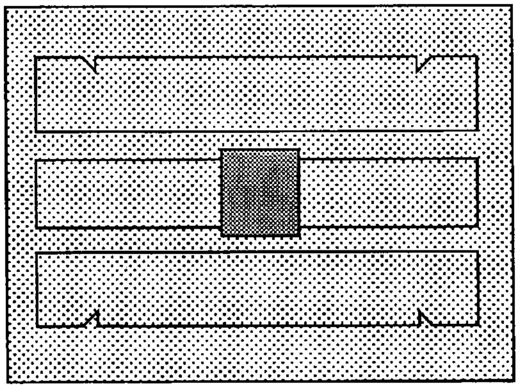
Figure 2J:
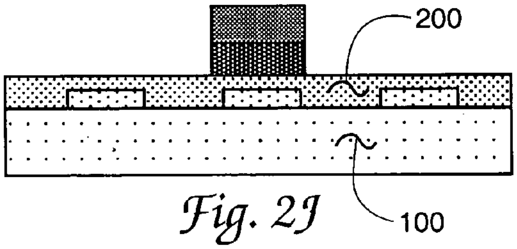

Expose the patterned wafer to deep ultraviolet light and develop the SF-11 resist 202 using Nano-101 developer, FIG. 2I and FIG. 2J.

Figure 2K:
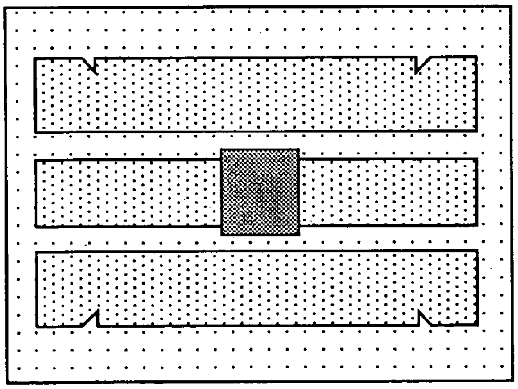
Figure 2L:
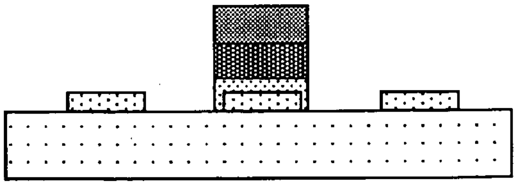

Etch the exposed thin-film dielectric film 200 using a dry or wet chemical etch, FIGS. 2K and 2L.

Figure 2M:
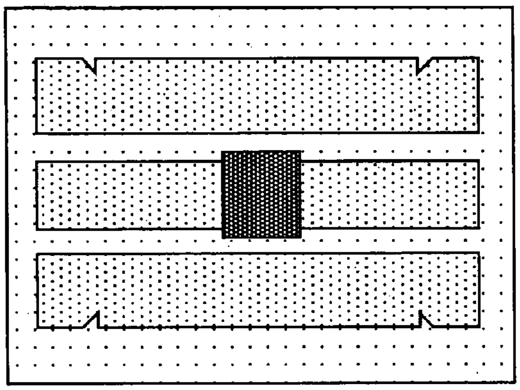
Figure 2N:
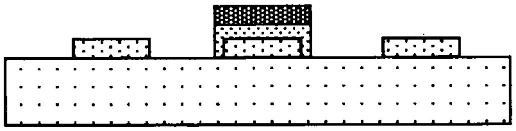

Strip the S-1813 resist 204 using an acetone rinse followed by an isopropyl alcohol and DI water rinse FIGS. 2M and 2N.

Figure 2O:
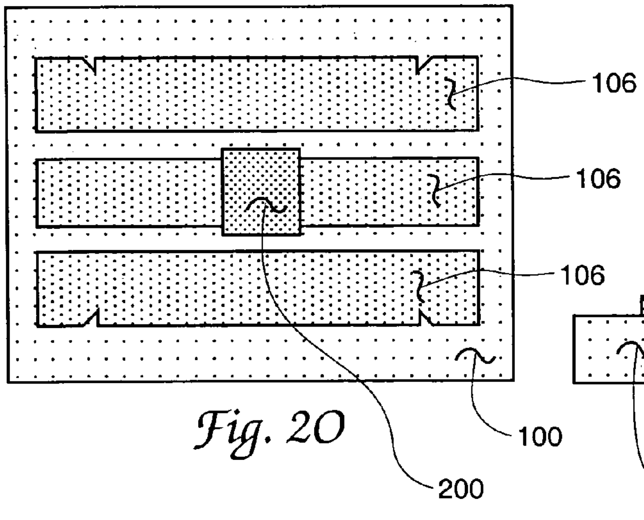
Figure 2P:
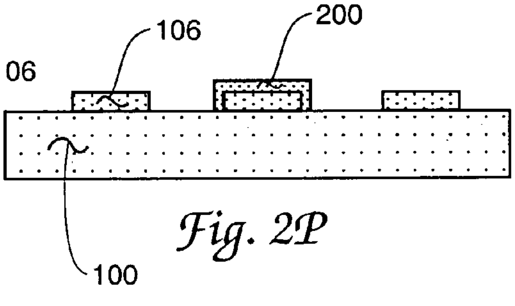

Strip the SF-11 resist 202 using hot (90° C.) 1165 remover, FIGS. 2O and 2P. For thick RF metal, delete this step to maintain planarization. The completed RF dielectric sequence is shown in the top and side views of FIG. 2O and FIG. 2P.

Sacrificial Layer Process

In the present invention a sacrificial layer-derived post determines the gap height of the switch and its switch open capacitance in the movable member-up-state. To explain in more detail, fabrication of a MEMS switch (i.e., a switch having a movable bridge or cantilever beam) requires a sacrificial layer to support the suspended portion of the beam during processing. This sacrificial layer is also herein referred-to as the post layer. The completed post is shown at 312 in FIG. 3K and FIG. 3L where the sacrificial layer or post layer is added to the switch portions fabricated in the FIG. 1 and FIG. 2 steps. Post height is determined by the thickness of the photoresist used during post formation. Spinning this photoresist at a slow speed results in a thicker film and a thinner film at higher speed. The achieved switch gap spacing can be varied from 1 to 5 micrometers with this process. Details of the FIG. 3 sacrificial layer process portion of the switch fabrication follow.

Figure 3A:
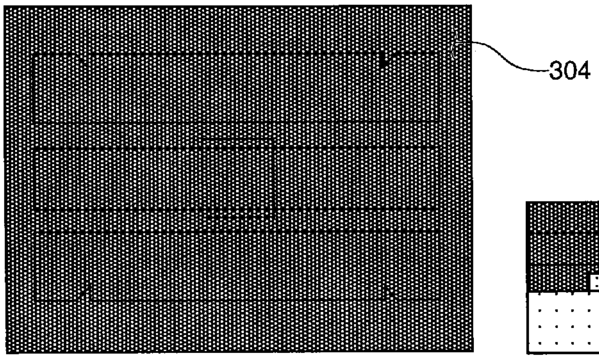
FIG. 3 in the drawings includes the views of FIG. 3A through FIG. 3L and shows a sacrificial layer metal fabrication sequence for a MEMS switch according to the present invention.
Figure 3B:
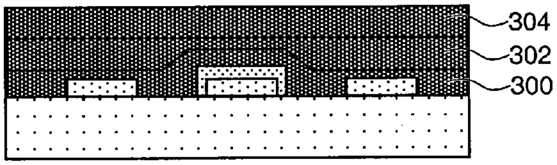

Spin coat the wafer with one coat of PMGI photoresist (SF-11), FIG. 3A, cure at 270° C. Repeat this process for three total coats of resist 300, 302 and 304 in FIG. 3B to form a three-micron stack thickness. The PMGI coats determine the gap height of the switches. SF-11 PMGI photoresist provides about 1.0 μm of thickness per layer. For thicker gap spacings, PMGI SF-19 resist could be used to achieve a 5.0 μm thickness per layer.

Figure 3C:
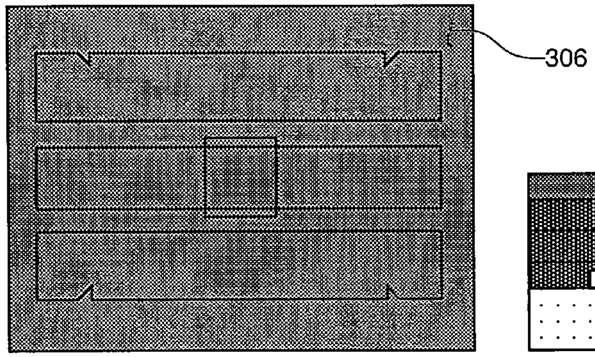
Figure 3D:
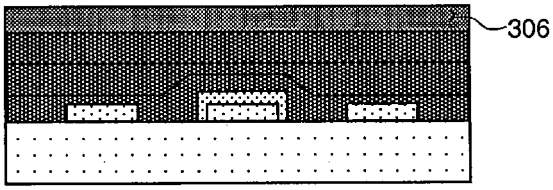

Spin coat the wafer with one coat of positive photoresist (S-1813), 306 in FIG. 3C and FIG. 3D, cure at 110° C.

Figure 3E:
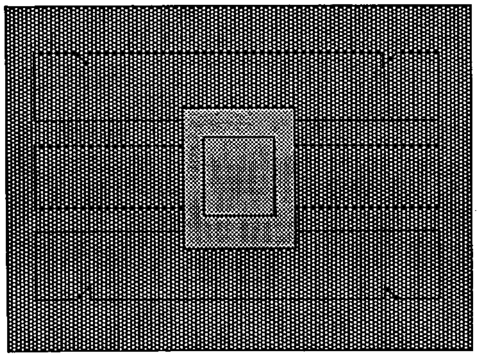
Figure 3F:
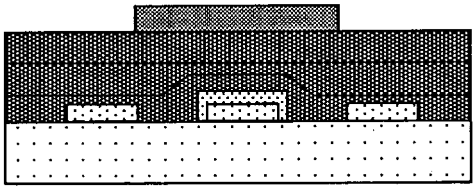

Using an I-line stepper or a contact lithography system, expose the coated wafer to the Sacrificial Layer mask and develop the S-1813 resist 306 using a diluted developer (351:DI), FIG. 3E and FIG. 3F.

Figure 3G:
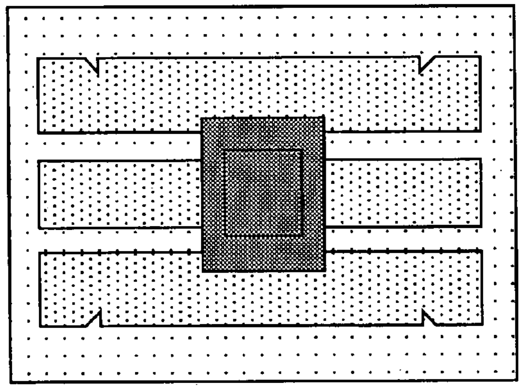
Figure 3H:
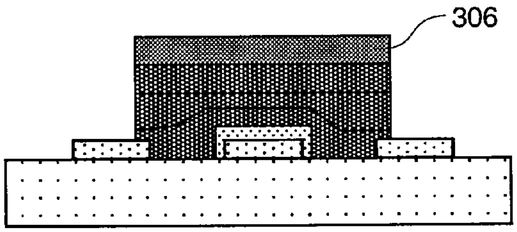

Expose the PMGI (SF-11) resist 300, 302 and 304 to deep ultraviolet light and develop the SF-11 resist 300, 302 and 304 using Nano-PMGI-101 developer, FIG. 3G and FIG. 3H.

Figure 3I:
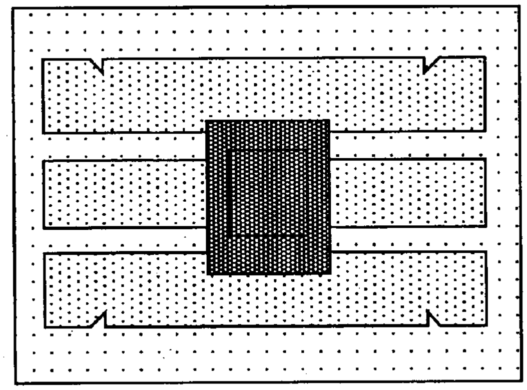
Figure 3J:
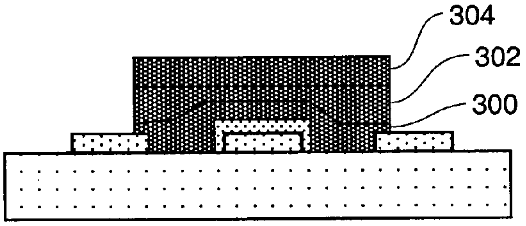

Strip the S-1813 resist 306 using acetone followed by an isopropyl alcohol rinse and a DI water rinse; FIG. 3I and FIG. 3J. The DI water rinse is desirable to minimize cracking of the PMGI photoresist 304.

Reflow the PMGI coating layers 300, 302 and 304 in a 250° C. hot air oven. The reflow step achieves a uniform sloped sidewall, 310 in FIG. 3L, for the layers 300, 302 and 304 to ensure continuous metal coverage in the Bridge Metal process. The completed sacrificial layer process is shown in FIG. 3K and FIG. 3L where the photoresist layers 300, 302 and 304 appear in merged condition at 312.

Bridge Metal Process

Bridge metal defines the top, movable portion of the present invention switch. The careful choice of bridge metallization minimizes curling of the switch. (See for example K. Leedy, et al, "Metallization Schemes for RF MEMS Switches", J. Vacuum Science Technology A 21(4) July/August 2003, pp. 1172–1177.)

Figure 3K:
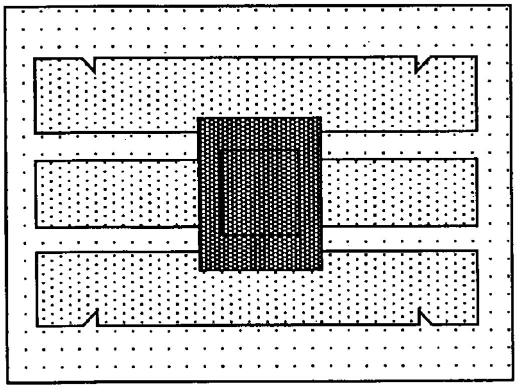
Figure 3L:
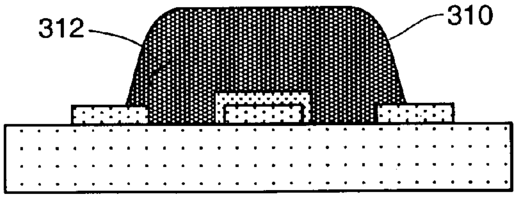

Spin coat the FIG. 3K and FIG. 3L wafer with one coat of a PMGI Lift-Off Resist such as Micro Chem Corp. LOR-10 photoresist 400, cure at 170° C., FIG. 4A and FIG. 4B. The resist chosen for this step should not interact with the existing PMGI sacrificial post resist at 312. The cure temperature should also be lower that the 250° C. reflow temperature of the previous FIG. 3K and FIG. 3L step.

Figure 4A:
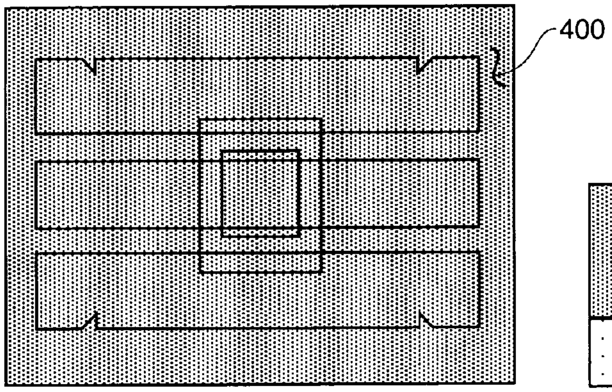
FIG. 4 in the drawings includes the views of FIG. 4A through FIG. 4L and shows a bridge metal fabrication sequence for a MEMS switch according to the present invention.
Figure 4B:
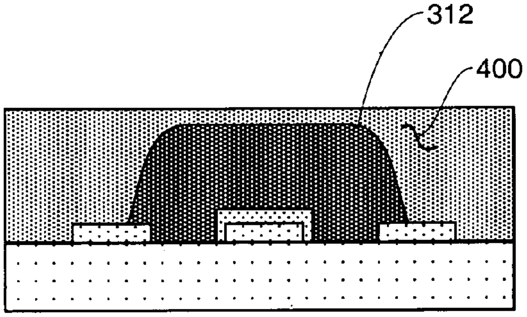
Figure 4C:
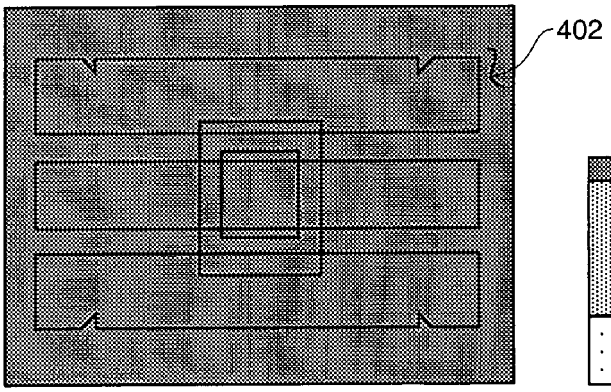
Figure 4D:
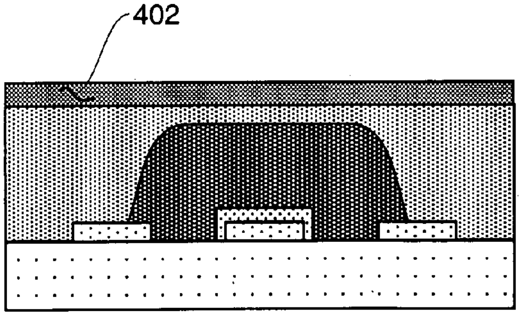

Spin coat the wafer with one coat of a positive resist (S-1813) 402, cure at 110° C., FIG. 4C and FIG. 4D.

Figure 4E:
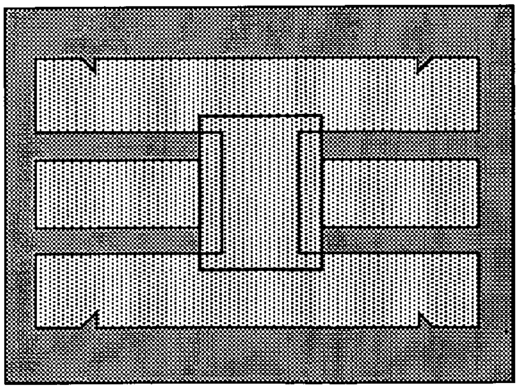
Figure 4F:
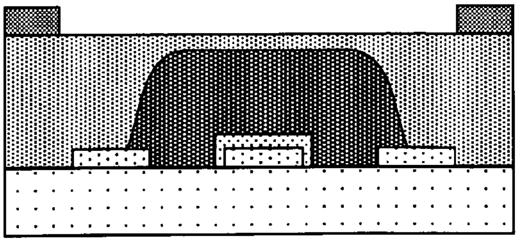
Figure 4G:
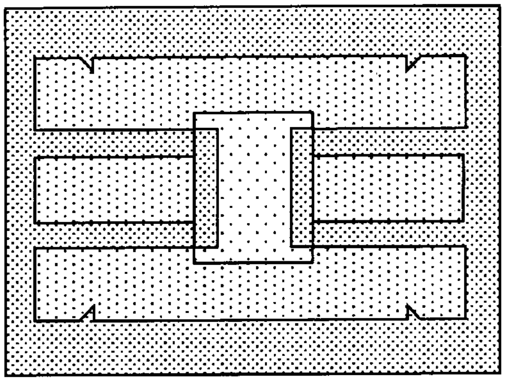
Figure 4H:
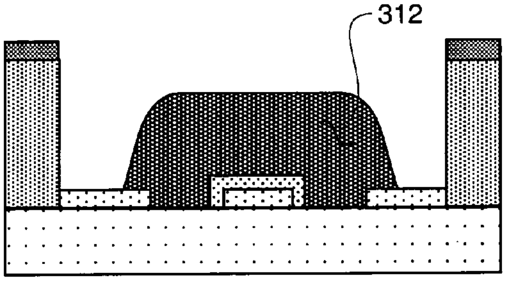

Using an I-line stepper or contact lithography system, expose the coated wafer to the Bridge Metal mask and develop the S-1813 resist 402 using a diluted developer (351:DI), FIG. 4E and FIG. 4F.

Develop the LOR-10 photoresist 400 using a tetramethylammonium hydroxide developer such as Shipley Microposit developer LDD-26W. This developer should not interact with the existing PMGI sacrificial post resist 312, FIG. 4G and FIG. 4H.

Figure 4I:
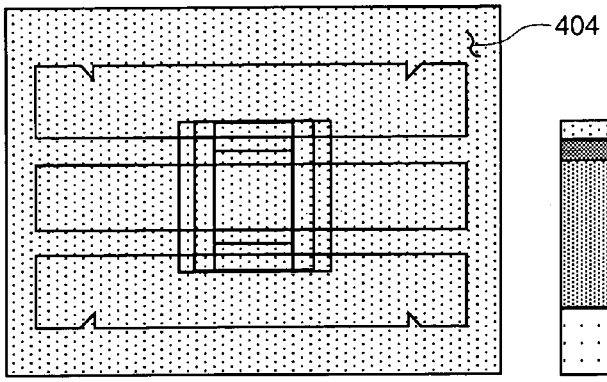
Figure 4J:
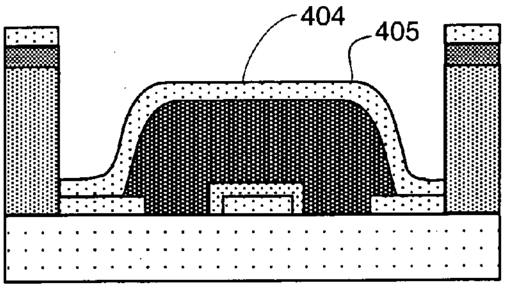

Coat the patterned wafer with a thin metal film such as 7000 Å of evaporated Au 404 in FIG. 4I and FIG. 4J. Notably this step uses gold that adheres to the exposed gold of the RF metal process without requiring an adhesion layer. Such an adhesion layer may produce a stress gradient within the film resulting in curling of the switch being fabricated. A thin adhesion layer (of Ti or Cr) may be used on the bridge metal top surface to promote cap adhesion.

Figure 4K:
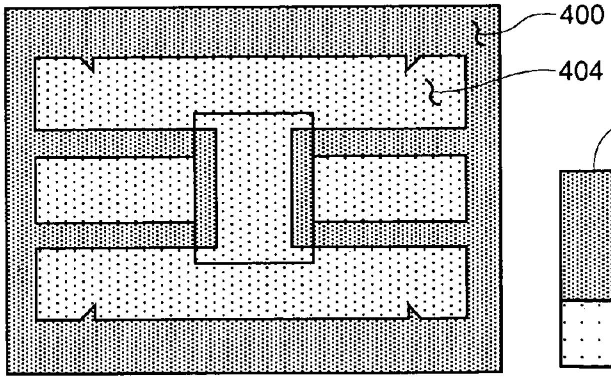
Figure 4L:
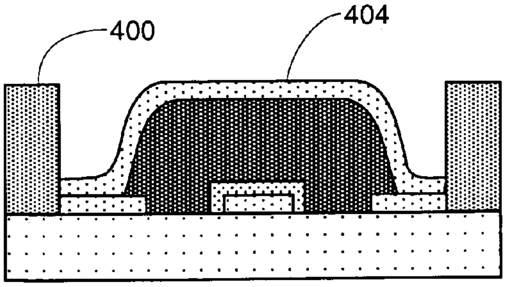

Lift-off the excess metal using tape and remove the S-1813 resist 402 using acetone, followed by an isopropyl alcohol rinse and a DI water rinse. The completed Bridge Metal step is shown in FIG. 4K and FIG. 4L.

Cap Sacrificial Layer Process

The cap sacrificial layer defines the region to be covered by the encapsulating shell. The thickness of the sacrificial layer determines the inner shell height over the switch. This process covers the captive switch and does not compromise the existing structures.

The ability to stack sacrificial layer materials such as photoresist on the FIG. 4 metal 404 of the movable switch element 405 without causing harmful distortion to the metal 404 is in fact believed to be a notable aspect of the present invention. Often it is found that the curing of newly stacked organic materials is so permanently disruptive to an underlying metal layer or an underlying oxide layer as to preclude such procedures. The materials, sub layer thickness measurements, temperatures and other details recited for the FIG. 5 sequence are therefore of special interest with respect to the present invention. Although this FIG. 5 sequence accomplishes the addition of a second sacrificial layer on top of a first sacrificial layer and its exposed metal, it is believed the disclosed sequence is applicable to the fabrication of more than two such layers as accomplished herein and can be extended to three or more layers without significant difficulty where needed.

Spin coat the FIG. 4K and FIG. 4L wafer with one coat of PMGI photoresist (SF-11), cure at 200° C. Repeat this step for three total coats of resist 500, 502 and 504 as appear in FIG. 5B. Three coats of SF-11 resist provide 3.0 μm gap spacing. This is the same PMGI photoresist used for the switch gap spacing 312 and should be cured at the indicated lower temperature to minimize impact on the existing films. PMGI SF-19 photoresist could be used for thicker gap spacing.

Figure 5A:
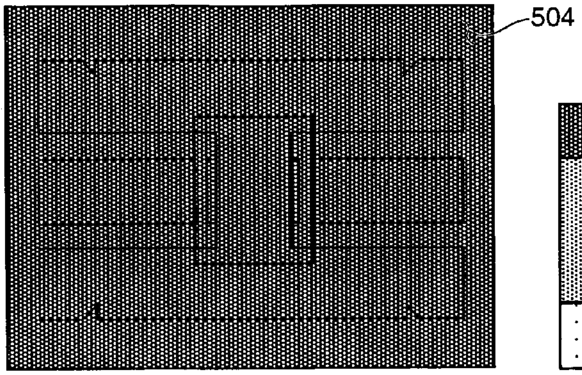
FIG. 5 in the drawings includes the views of FIG. 5A through FIG. 5N and shows a cap sacrificial layer process for a MEMS switch according to the present invention.
Figure 5B:
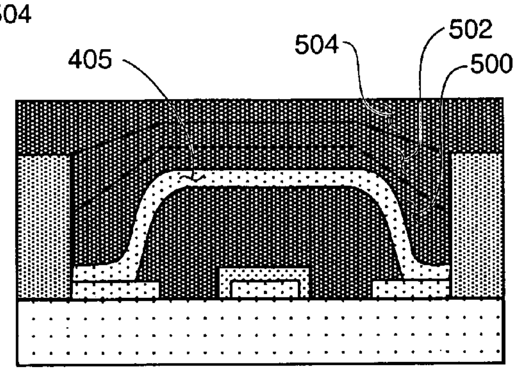
Figure 5C:
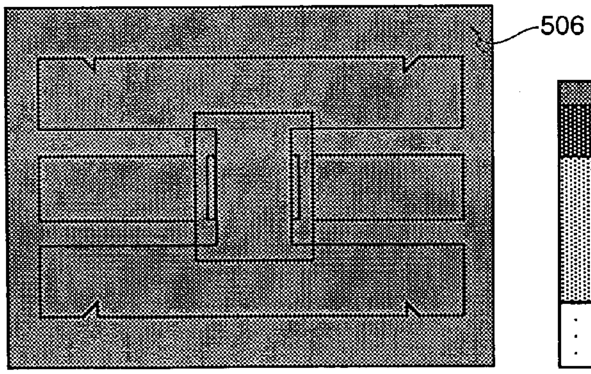
Figure 5D:
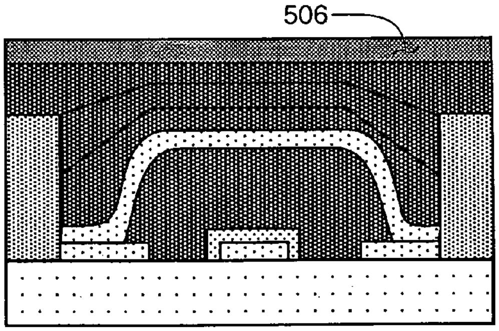

Spin-coat the wafer with one coat of positive photoresist (S-1813) 506, cure at 110° C., FIG. 5C and FIG. 5D.

Figure 5E:
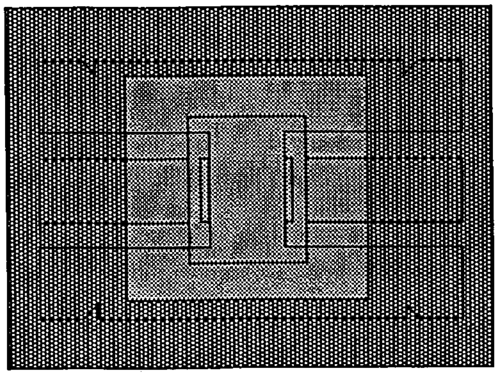
Figure 5F:
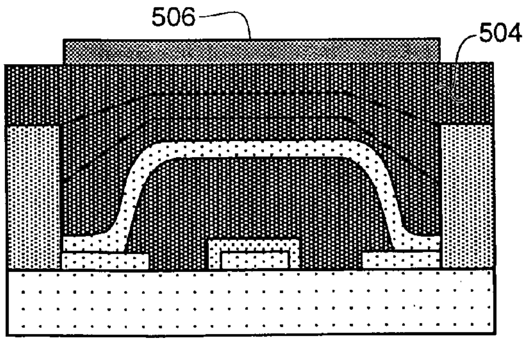

Using an I-line stepper or contact lithography system, expose the coated wafer to the Cap Sacrificial mask and develop the S-1813 resist 506 using diluted developer (351:DI), FIG. 5E and FIG. 5F.

Figure 5G:
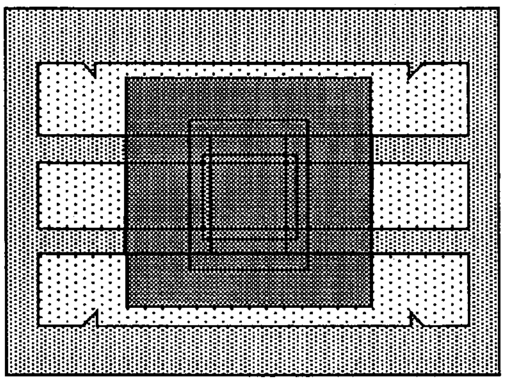
Figure 5H:
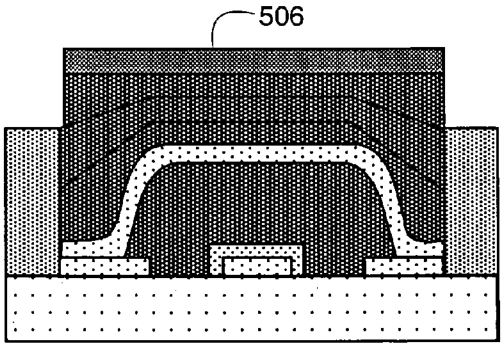

Expose the PMGI SF-11 resist 500, 502 and 504 to deep ultraviolet light and develop the SF-11 resist 500, 502 and 504 using Nano-101 developer, FIG. 5G and FIG. 5H.

Figure 5I:
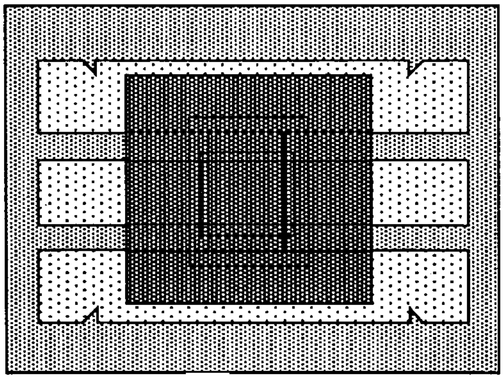
Figure 5J:
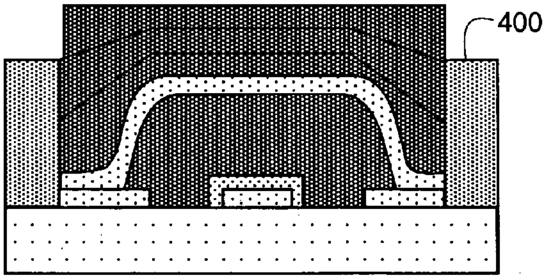

Strip the S-1813 resist 506 using acetone followed by an isopropyl alcohol rinse and DI water rinse, FIG. 5I and FIG. 5J.

Figure 5K:
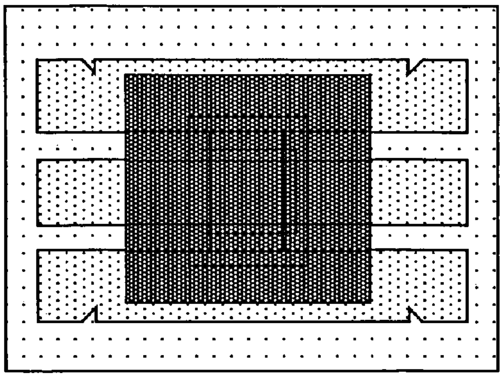
Figure 5L:
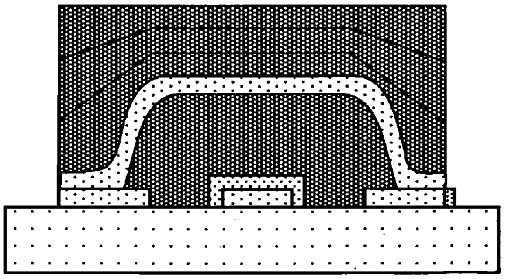

Strip the remaining lift-off resist (LOR-10) 400 using a tetramethylammonium hydroxide developer such as Shipley Microposit developer LDD-26W, followed by a DI water rinse and nitrogen dry, FIG. 5K and FIG. 5L.

Reflow the PMGI coated wafer in a 250° C. hot air oven. This reflow provides a uniform sloped sidewall 508 required for the capping layer step coverage. The reflow process should not exceed 250° C. to minimize impact on the existing PMGI films 312. The exposure time for this reflow temperature is preferably made somewhat short in the interest of damage avoidance to the underlying layers of a device; exposure times in the range of 60 to 300 seconds are thus found to be practical. No adverse impacts on the existing films have been observed. The completed second sacrificial layer step is shown in FIG. 5M and FIG. 5N.

Capping Layer Process

Figure 11:
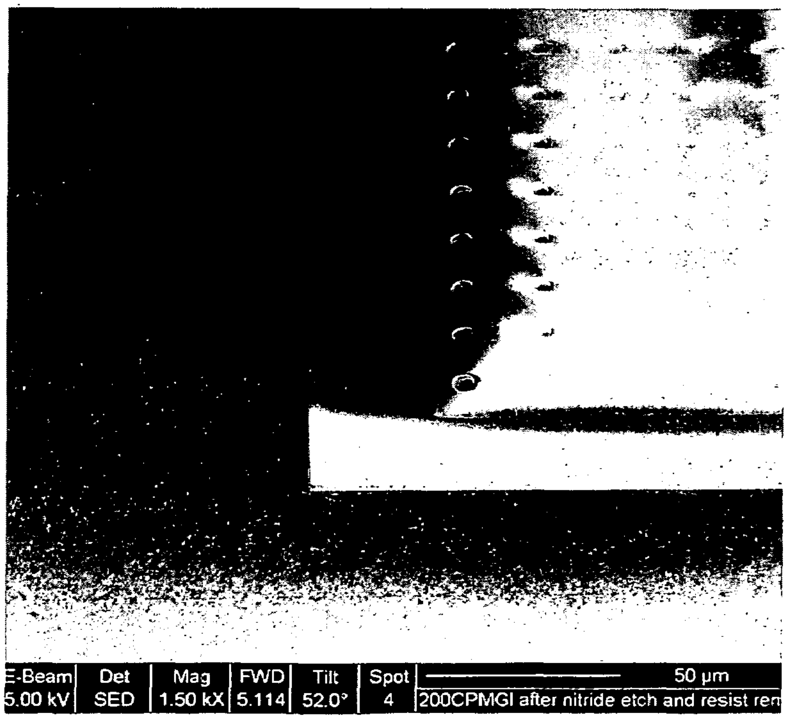
FIG. 11 in the drawings shows a MEMS switch dielectric shell member according to the present invention.

The capping layer defines the dielectric shell that will enclose the RF MEMS switch. This step also defines access holes or tunnels within the dielectric shell allowing for removal of the sacrificial layer photoresist of the shell and the switch. Access holes are shown in FIG. 11 of the drawings. Access tunnels are shown in the FIG. 14 and FIG. 15 drawings. Although a combination of access holes and access tunnels may be used in the invention one or the other of these communication paths from outside to inside of the dielectric enclosure is believed a satisfactory arrangement. Because of the larger aperture dimensions involved, the resulting improved flow of reactant materials achieved and the difficulty in fabricating the small holes shown in, for example, FIG. 12 and FIG. 13 we have found the use of tunnels to be the most desirable arrangement.

Figure 5M:
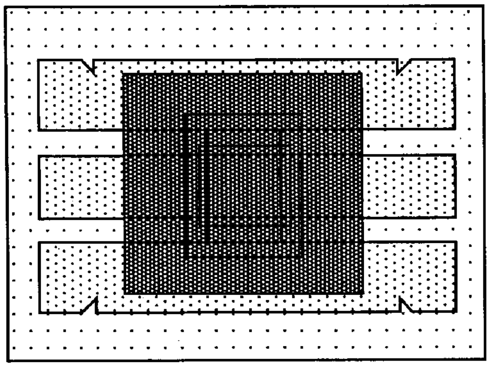
Figure 5N:
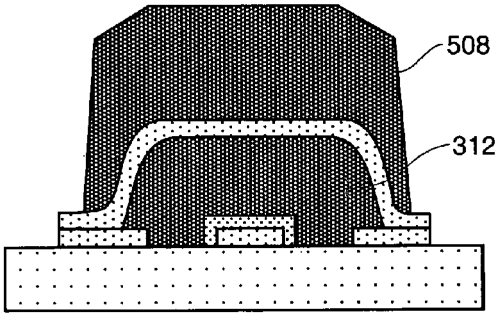
Figure 6A:
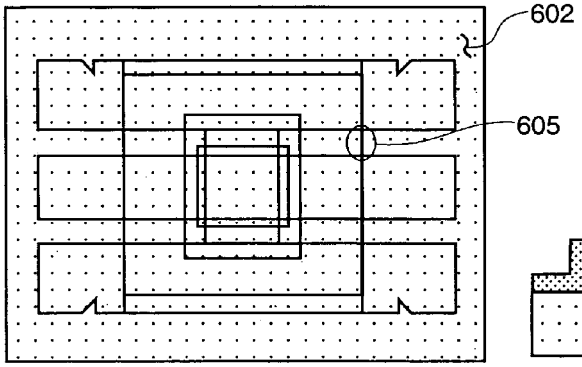
FIG. 6 in the drawings includes the views of FIG. 6A through FIG. 6L and shows a capping layer fabrication sequence for a MEMS switch according to the present invention.
Figure 6B:
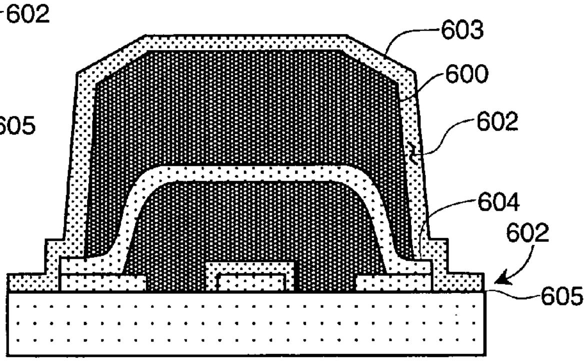

Coat the FIG. 5M and FIG. 5N wafer with a thin adhesion layer 600 composed of 0.01 μm oxygen rich sputtered alumina, $Al_2O_3$, followed by a thick dielectric film, of nominally 1.67 μm sputtered silicon nitride $Si_3N_4$ 602, FIG. 6A and FIG. 6B. The alumina layer provides adhesion of the silicon nitride film 602 of cap 603 to the gold and sapphire substrate surfaces at 604 and 605. Films deposited by PECVD at low temperatures (below 200° C.) could also be used. Possible alternative dielectric films at 602 also include alumina $Al_2O_3$.

The sputtered silicon nitride film 602 used in the cap at 603 has undergone extensive deposition development. Silicon nitride thin films may be fabricated by reactive RF sputtering using a 99.999% pure Si target with a Denton Vacuum Discovery-18 type of magnetron sputtering system and a base vacuum of $5\times10^{-6}$ Pa. A mass flow regulated Ar—$N_2$ sputtering pressure of 0.53 Pa and 400 watts of forward power result in a nominal deposition rate of 0.13 nm/s. The $N_2$ partial flow rate (the ratio of the nitrogen flow rate to the total flow rate of nitrogen and argon) is 50%. Deposited films for the shell cap at 603 are 1670 nm thick and have an intrinsic compressive stress of 102 MPa.

Figure 6C:
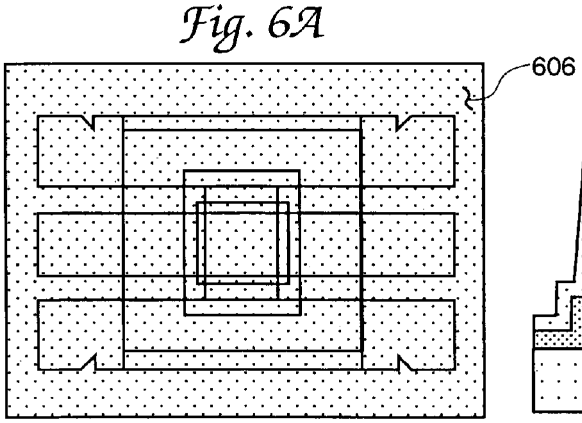
Figure 6D:
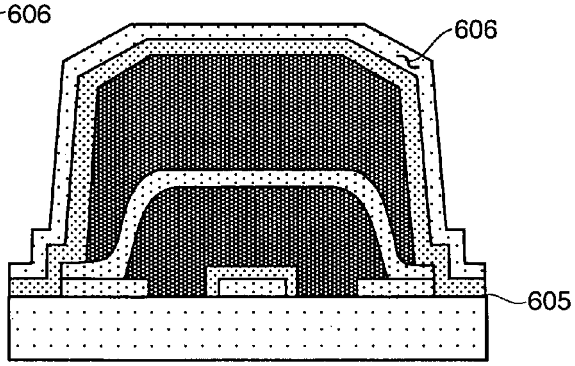

Spin coat the dielectric coated wafer with one coat of positive photoresist (S-1818) 606, cure at 110° C., FIG. 6C and FIG. 6D. A thick photoresist 606 is necessary to serve as an etch mask for the cap layer dielectric. S-1818 photoresist provides about 1.8 μm of film thickness per coat.

Figure 6E:
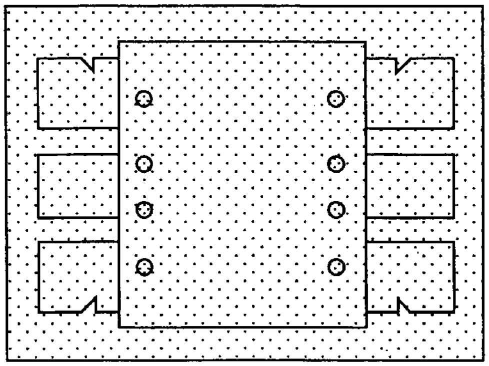
Figure 6F:
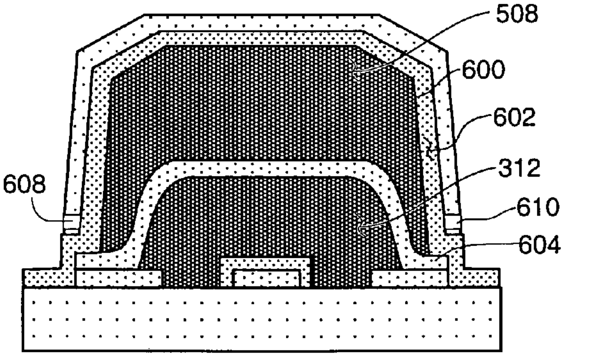

Using an I-line stepper or contact lithography system, expose the coated wafer to the Capping Layer mask and develop the S-1818 resist 606 using a diluted developer (351:DI), FIG. 6E and FIG. 6F. Access holes 804 (in FIG. 8B) and access tunnels 608 and 610 are also defined in this lithography step.

Figure 6G:
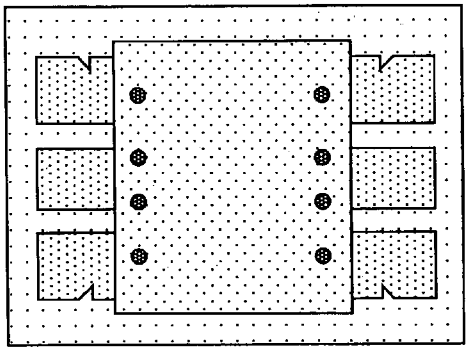
Figure 6H:
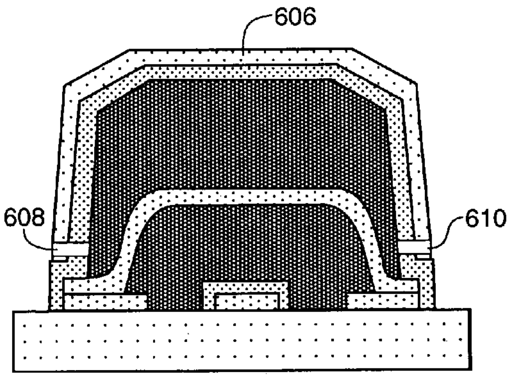

Etch the exposed thick film dielectric at 602 using a dry or wet chemical etch, FIG. 6G and FIG. 6H. Visual examination should ensure the access holes or tunnels 608 and 610 are cleared to allow complete removal of the PMGI sacrificial resists at 508 and 312.

Figure 6I:
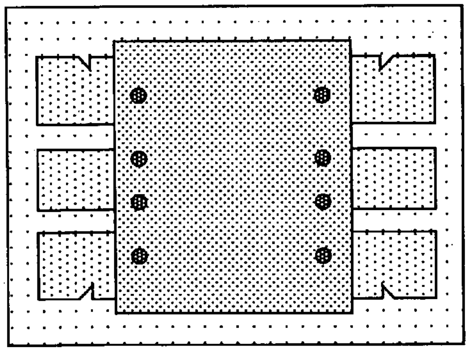
Figure 6J:
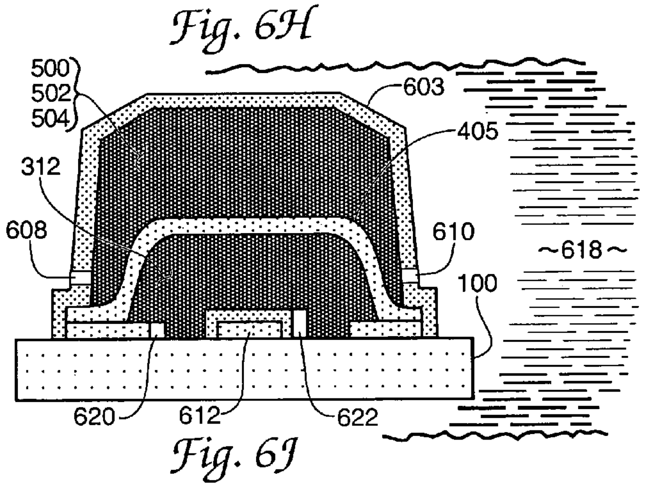

Strip the S-1818 resist 606 using acetone followed by an isopropyl alcohol rinse and a DI water rinse, FIG. 6I and FIG. 6J.

Figure 6K:
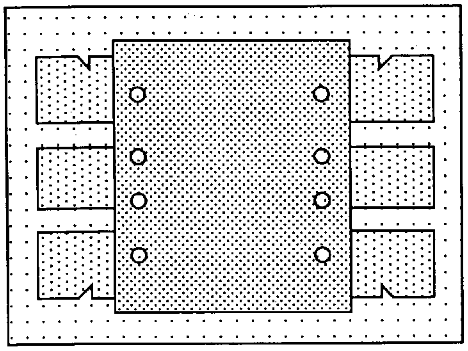
Figure 6L:
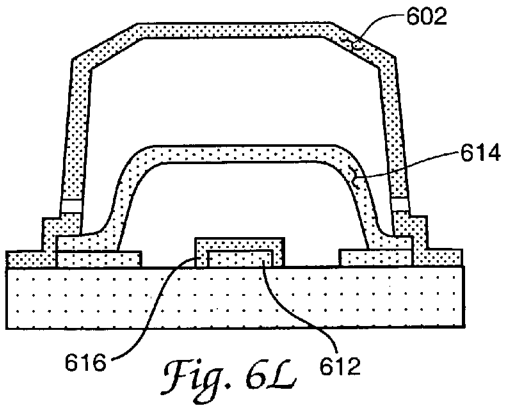

Strip all the remaining PMGI SF-11 photoresist 508 and 312 using a hot (90° C.) 1165 stripper 618 acting via access holes 804 and tunnels 608, 610 etc., FIG. 6K and FIG. 6L, to achieve the structure shown in these FIGs.

Immediately rinse the wafer in a submersion bath of isopropyl alcohol. Repeat the isopropyl alcohol bath step 3–4 times. Rinse the wafer in a bath of methanol. Repeat the methanol bath rinse step 3–4 times. Complete the release step by using a carbon dioxide critical point dry. The completed Capping Layer step with released RF MEMS switch is shown in FIG. 6K and FIG. 6L.

Figure 14:
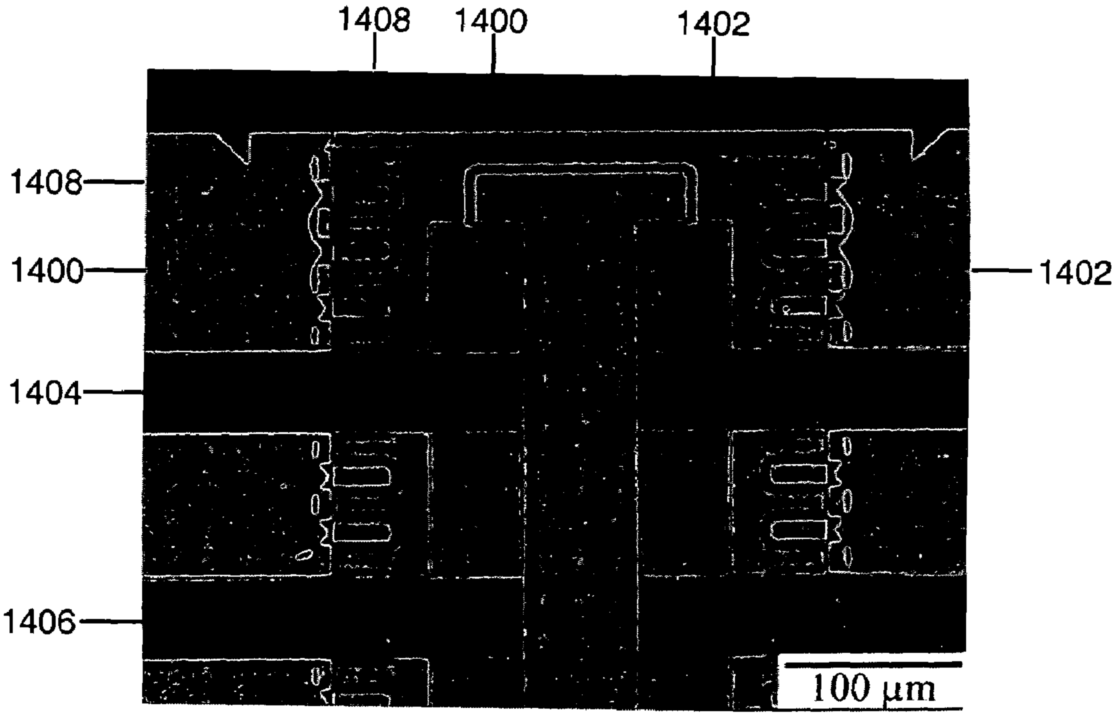
FIG. 14 in the drawings shows an interior view of an enclosed and released from captivity switch according to the invention.
Figure 15:
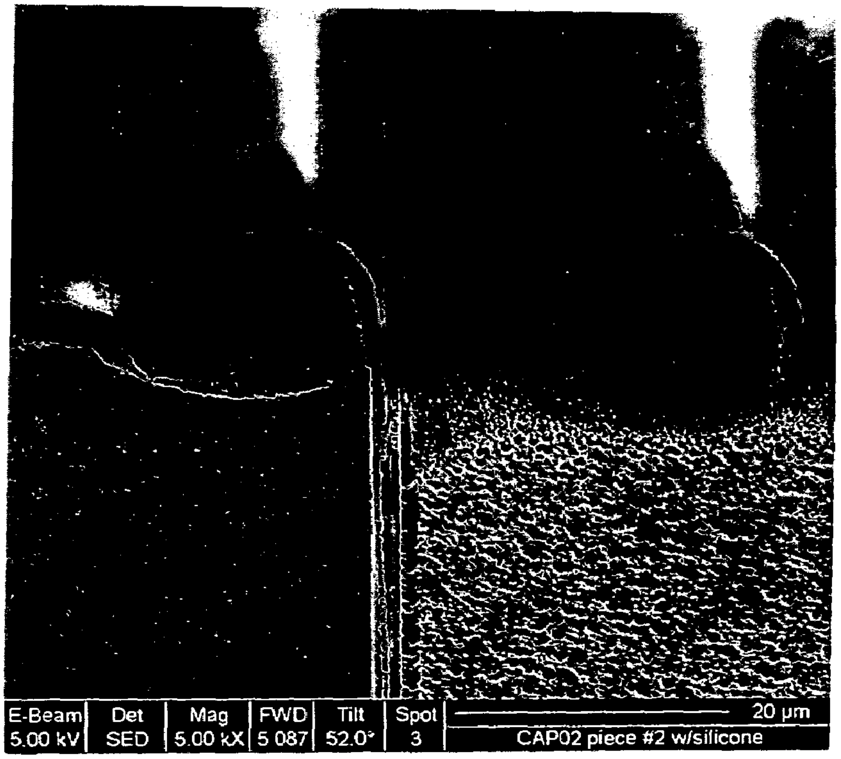
FIG. 15 in the drawings shows tunnel structure usable with the enclosure of the present invention.

Although not expressly shown in the drawings the access tunnels of FIG. 14 and FIG. 15 in the drawings are preferably formed during the FIG. 6 sequence. This may be accomplished by providing the capping layer mask with combination tooth-like extensions at its periphery followed by covering these extensions and removal of the mask material.

PECVD Sealing Process

A Plasma Enhanced Chemical Vapor Deposition (PECVD) process may be used to seal the access holes and tunnels of the encapsulation shell.

Bake out the FIG. 6K and FIG. 6L encapsulated wafers in a 90°, nitrogen oven for 1 hour. Coat the wafer with a thin adhesion layer composed of 0.01 micrometer of oxygen rich sputtered alumina, $Al_2O_3$, followed by a thick film of PECVD silicon oxide, nominally 2 μm, 700 in FIG. 7A and FIG. 7B. PECVD $SiO_2$ is deposited at 270 degrees Centigrade and 900 millitorrs of pressure. Since such PECVD plugs the access tunnels or access holes such as 608 and 610 the PECVD $SiO_2$ is not observed to deposit within the encapsulated shell. As an alternative, PECVD silicon nitride may also be used.

Figure 7A:
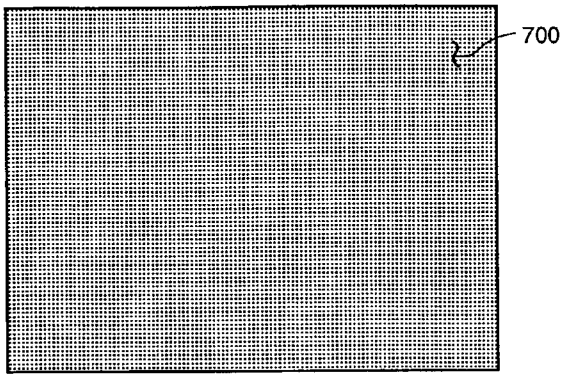
FIG. 7 in the drawings includes the views of FIG. 7A through FIG. 7J and shows a PECVD sealing sequence for the hole and tunnel interior to exterior communication paths of a MEMS switch according to the present invention.
Figure 7B:
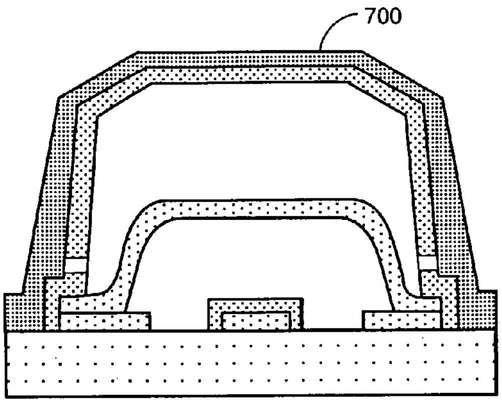
Figure 7C:
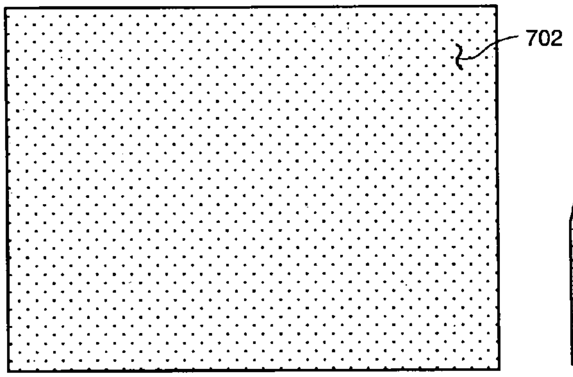
Figure 7D:
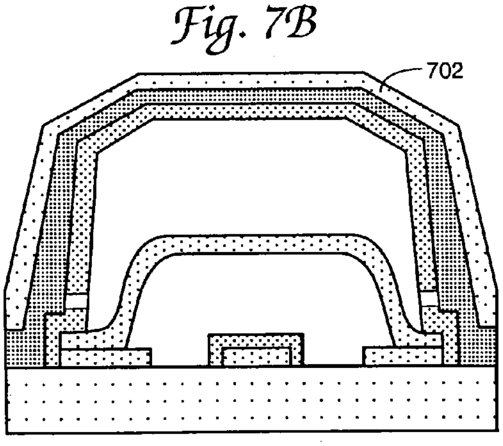

Spin coat the wafer with one coat of positive photoresist (S-1818) 702 in FIG. 7C and FIG. 7D, cure at 110° C. A photoresist is necessary to serve as an etch mask for the sealing layer dielectric.

Figure 7E:
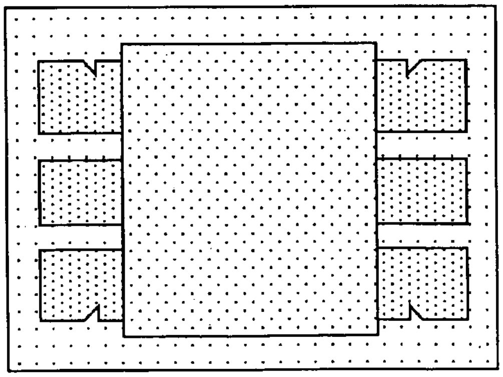
Figure 7F:
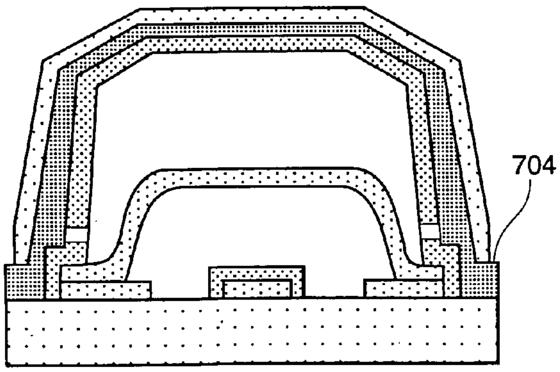

Using an I-line stepper or contact lithography system, expose the coated wafer to the Sealing Layer mask and develop the S-1818 resist 702 using a diluted developer (351:DI), FIG. 7E and FIG. 7F.

Figure 7G:
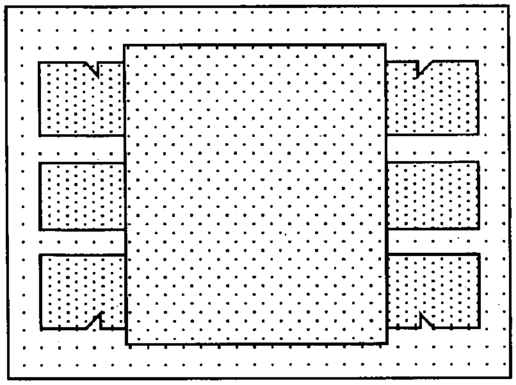
Figure 7H:
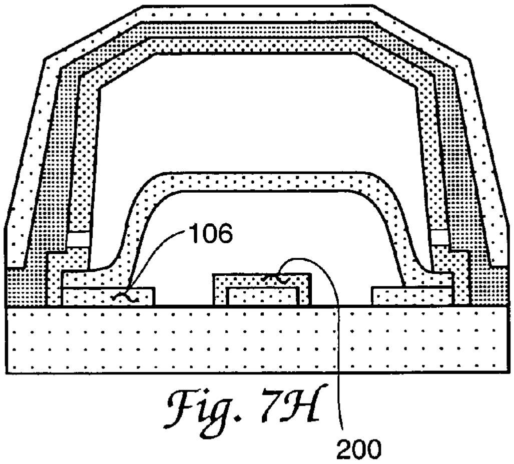

Etch the exposed thick film dielectric at 704 in FIG. 7E and FIG. 7F using a dry or wet chemical etch, FIG. 7G and FIG. 7H.

Figure 7I:
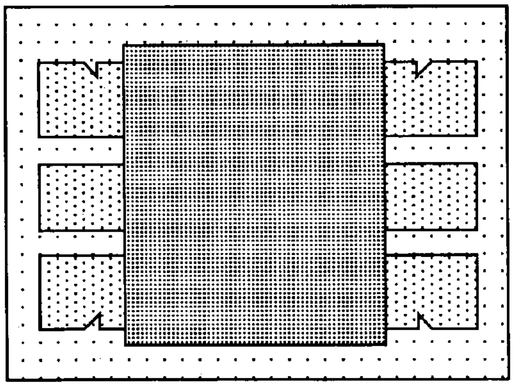
Figure 7J:
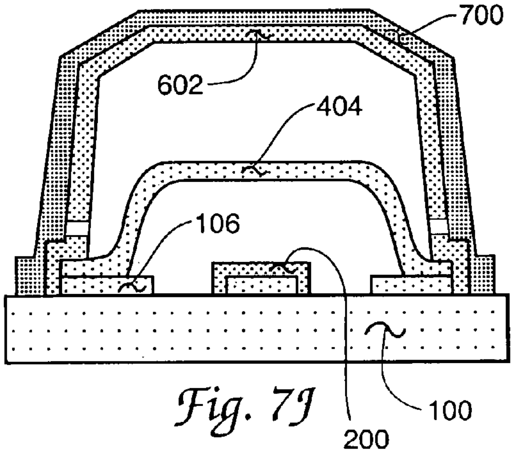

Strip the S-1818 resist 702 using acetone followed by an isopropyl alcohol rinse and a DI water rinse, FIG. 7I and FIG. 7J. The completed PECVD sealed switches are shown in FIG. 7I and FIG. 7J.

Spin-on-Glass Sealing Process

The spin-on-glass process may also be used to seal the access holes in the encapsulation shell. The low viscosity of the spin-on-glass minimizes penetration into the access holes or tunnels. (See for example H. Elderstig and P. Wallgren, "Spin deposition of polymers over holes and cavities", Sensors and Actuators A 46–46, 1995, pg. 95–97.)

Figure 8A:
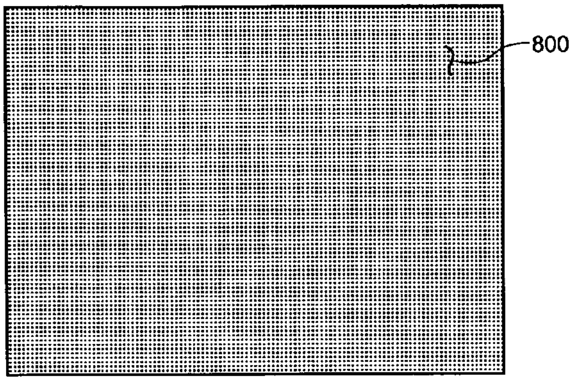
FIG. 8 in the drawings includes the views of FIG. 8A through FIG. 8J and shows a spin on glass sealing sequence for the hole and tunnel interior to exterior communication paths of a MEMS switch according to the present invention.
Figure 8B:
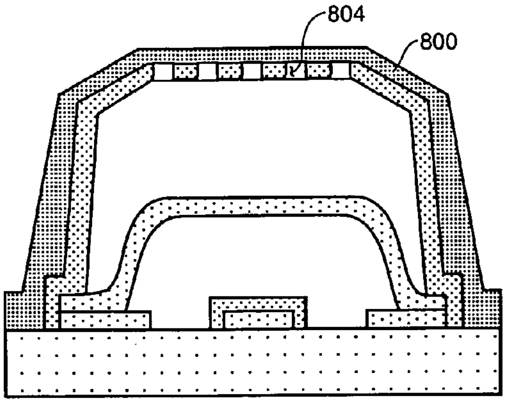

Spin coat the FIG. 6K and FIG. 6L wafer with a spin-on-glass film 800 such as 3 micrometers of Honeywell Accuflo-3025, cure the film at 160° C., 200° C., and 240° C., FIG. 8A and FIG. 8B. A three-step sequential cure cycle using progressively higher temperatures is desirable to completely cure this type of spin-on glass. A single layer is formed. The cap holes are formed in FIG. 6E and FIG. 6F; they may be at the sides (608 and 610) or on top as shown at 804 or in each of these locations.

Figure 8C:
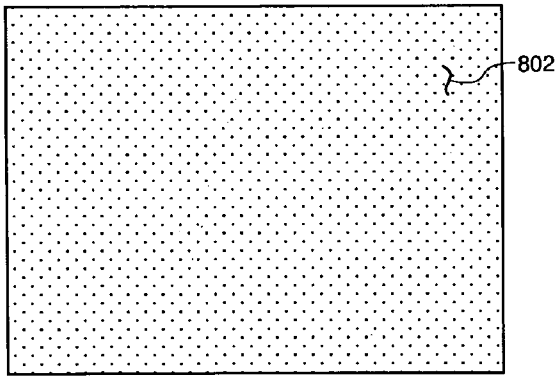
Figure 8D:
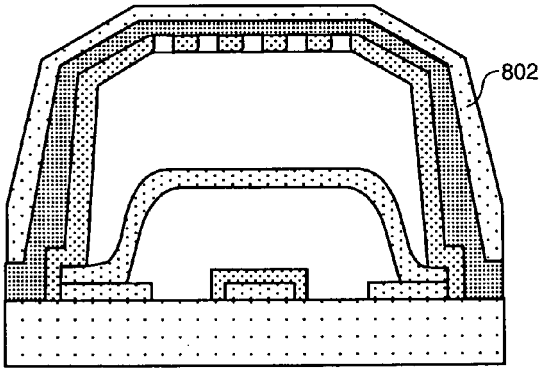
Figure 8E:
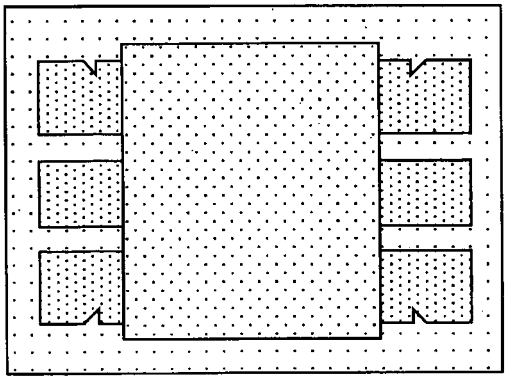
Figure 8F:
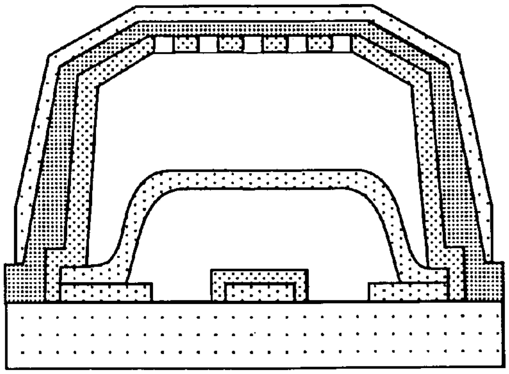

Spin coat the wafer with a thick positive photoresist, 802 in FIG. 8C and FIG. 8D, such as Hoechst Celanese Corp. AZ-9260 resist, cure at 110° C. This photoresist will serve as an etch mask for the spin-on-glass. This resist provides a 5–6 μm film thickness.

Using an I-line stepper or contact lithography system, expose the AZ-9260 resist-coated wafer to the Sealing mask and develop the AZ-9260 photoresist with a diluted potassium hydroxide developer such as Hoechst Celanese Corp. AZ-400K, FIG. 8E and FIG. 8F.

Figure 8G:
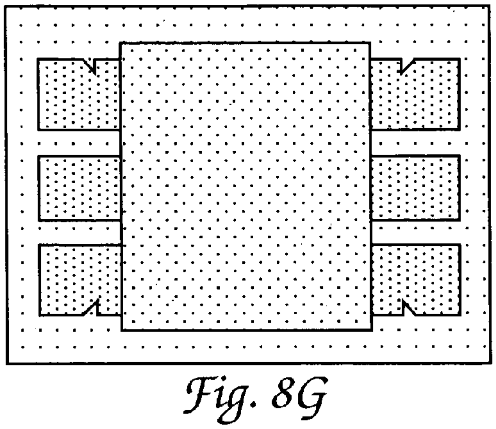
Figure 8H:
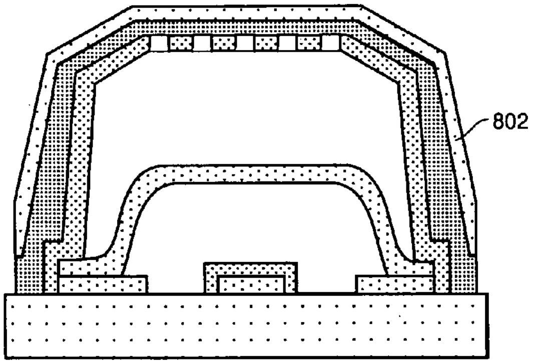

Etch the patterned spin-on-glass 800 using a dry or wet chemical etch, FIG. 8G and FIG. 8H.

Figure 8I:
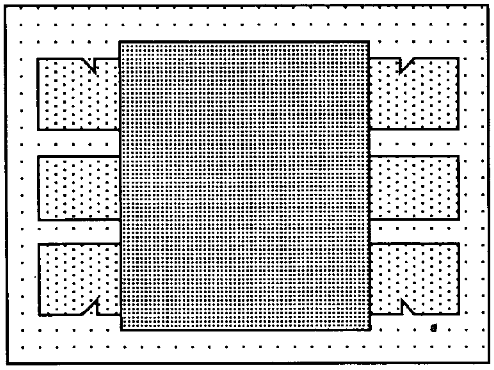
Figure 8J:
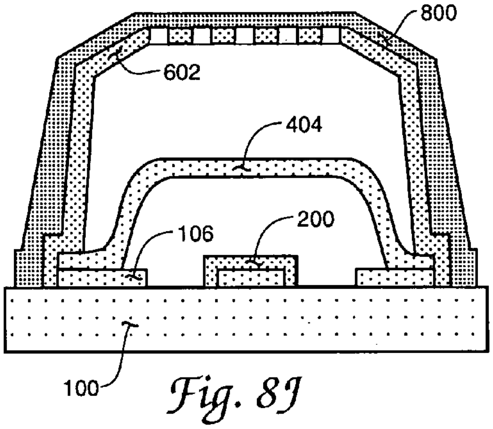

Strip the AZ-9260 photoresist 802 using acetone followed by an isopropyl alcohol rinse. The completed spin-on-glass sealing process is shown in FIG. 8I and FIG. 8J.

Epoxy Sealing Process

This alternate sealing process involves deposition of epoxy droplets onto individual switch caps. For this process, a dam can be fabricated around the switch to contain the epoxy however epoxy sealing without such a dam is also feasible. This process may also be used as an alternative after the step of FIG. 6J above.

For the epoxy sealing process, the sacrificial layers at 312 and 508 are not initially removed.

Spin coat the wafer with a thick negative photoresist such as MicroChem. Nano SU-8-2007, 900 in FIG. 9C and FIG. 9D, cure at 95° C. This resist provides~7.0 μm film thickness.

Figure 9A:
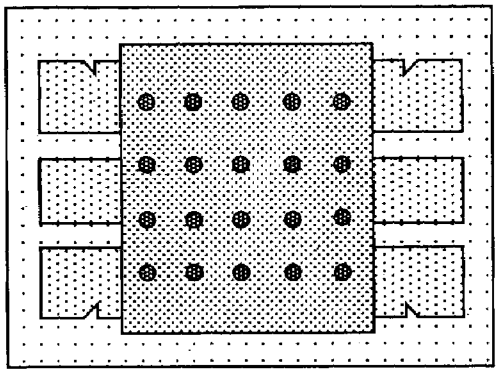
FIG. 9 in the drawings includes the views of FIG. 9A through FIG. 9J and shows an epoxy sealing sequence for the hole and tunnel interior to exterior communication paths of a MEMS switch according to the present invention.
Figure 9B:
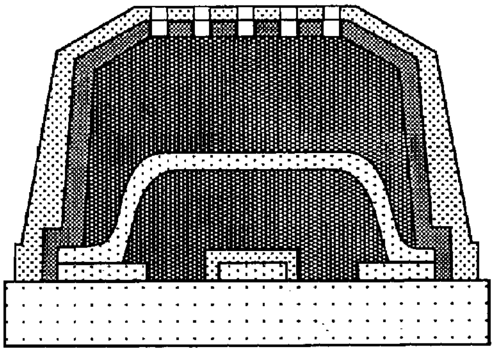
Figure 9C:
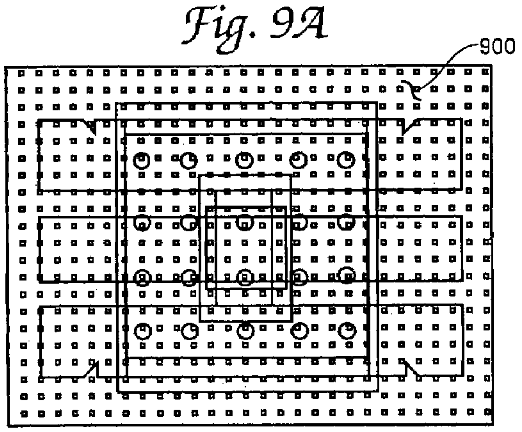
Figure 9D:
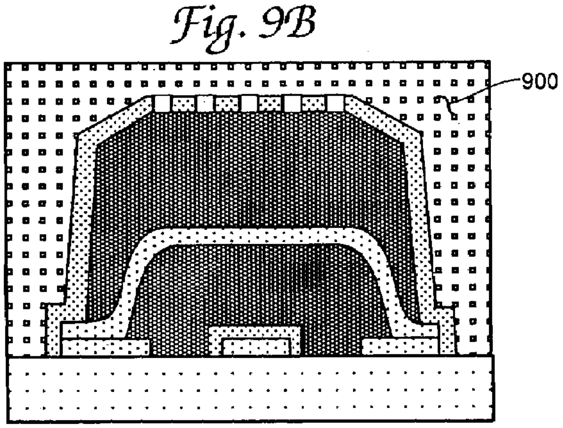
Figure 9E:
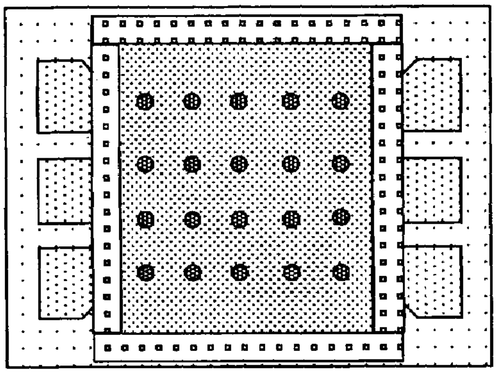
Figure 9F:
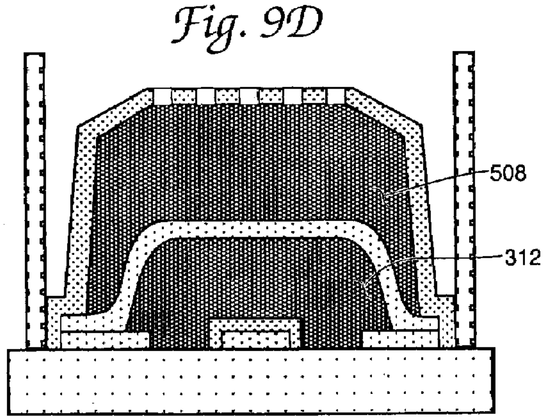
Figure 9G:
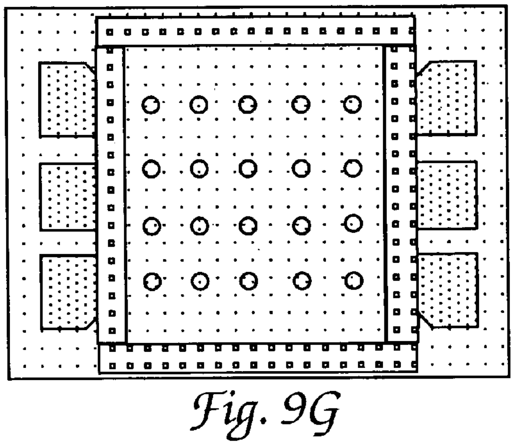
Figure 9H:
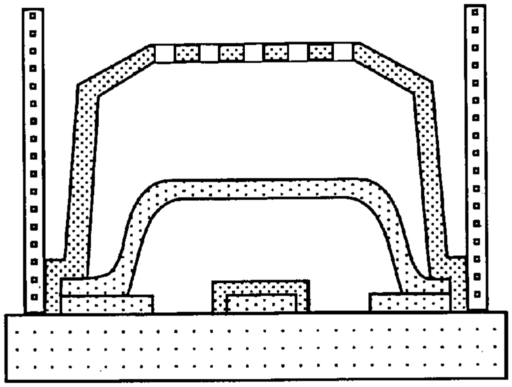

Using an I-line stepper or contact lithography system, expose the coated wafer to the Sealing Ring mask and develop the Nano SU-8-2007 using an ethyl lactate and diacetone alcohol developer such as MicroChem SU-8 Developer, FIG. 9E and FIG. 9F.

Strip the remaining PMGI SF-11 photoresist 508 and 312 using 90° C. 1165 stripper. Immediately rinse the wafer in several baths (3–4) of isopropyl alcohol, followed by rinsing in baths of Methanol, and a carbon dioxide critical point dry, FIG. 9G and FIG. 9H.

Figure 9I:
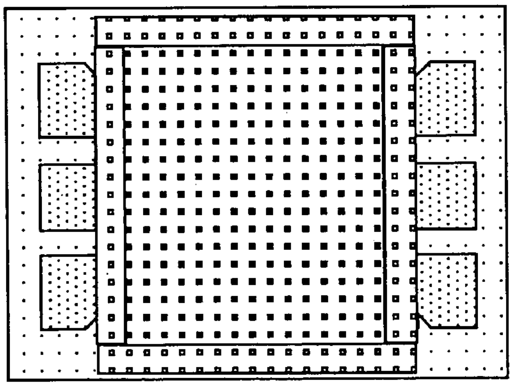
Figure 9J:
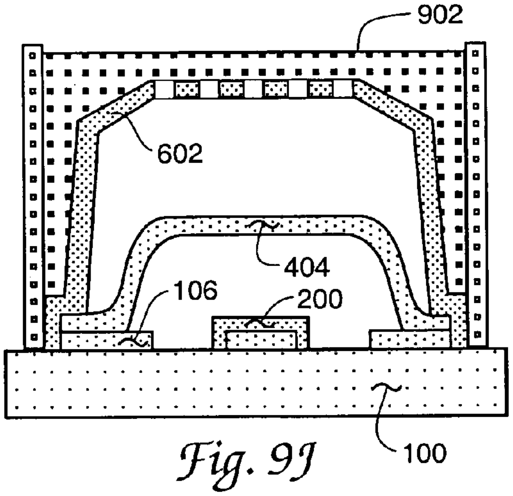

Coat the switch shells with an epoxy sealant 902 such as OptoCast 3401 or 3410 supplied by Electronics Materials Corp. Cure the epoxy using UV light followed by a 125° C. bake. The completed epoxy sealing process is shown in FIG. 9I and FIG. 9J.

Comparative Discussion:

Now that the foregoing formal description of a MEMS capacitance coupled radio frequency switch device and fabrication sequence has been disclosed, it may be helpful to an appreciation of the invention to consider several differences between the disclosed fabrication sequence and the fabricated device in comparison with the more conventional fabrication sequences and devices of similar general nature as are known in the art.

Readers familiar with the MEMS device art will for example appreciate that the device fabricated in the disclosed sequence is of an electrical switch nature as opposed to a transducer or other MEMS device and that such MEMS switches are attended by a somewhat unique collection of characteristics and susceptibilities. First among these characteristics and susceptibilities is a sensitivity to normal semiconductor device fabrication temperatures, temperatures in the 900° Centigrade region for example. Temperatures of this magnitude and even lower (but especially higher temperatures) are found to be destructive to the metal components of a MEMS switch device in that they result in warping or distortion of previously fabricated switch metal components.

In addition to temperature sensitivity it appears significant that the disclosed fabrication sequence enables the use of silicon oxide, silicon nitride and other dielectric materials in the fabrication of the switch device. These especially useful materials are excluded from possible employment in many MEMS devices that are dependent on hydrofluoric acid etching steps in achieving release of a stabilized transducer or other element for example or for other processing steps. A wet hydrofluoric acid etch removal would typically require a water rinse to remove all acid; any water rinse employed can however be catastrophic to a MEMS switch structure. Use of hydrofluoric acid also precludes the use of many dielectrics in the switch and shell including silicon dioxide, $SiO_2$, silicon nitride, $Si_3N_4$ and alumina, $Al_2O_3$; this is especially true for a switch dielectric where precise thickness and integrity should be maintained. Thus in the above disclosed processing sequence a release of switch elements from their bound state by an organic material using an organic solvent rather than an acid, is for example employed.

A notable attribute of the present invention MEMS switch processing is the achieved seamless merging of switch formation, dielectric enclosure and dielectric enclosure sealing operations in a single integrated processing sequence, a sequence performable at the integral wafer level of MEMS fabrication as opposed to during individual die processing. Notably the photoresists and other materials involved in closure of the MEMS package and sealing of the closed package are either the same as those already employed in the fabrication of switch elements or of compatibility with these already employed materials.

Figure 10:
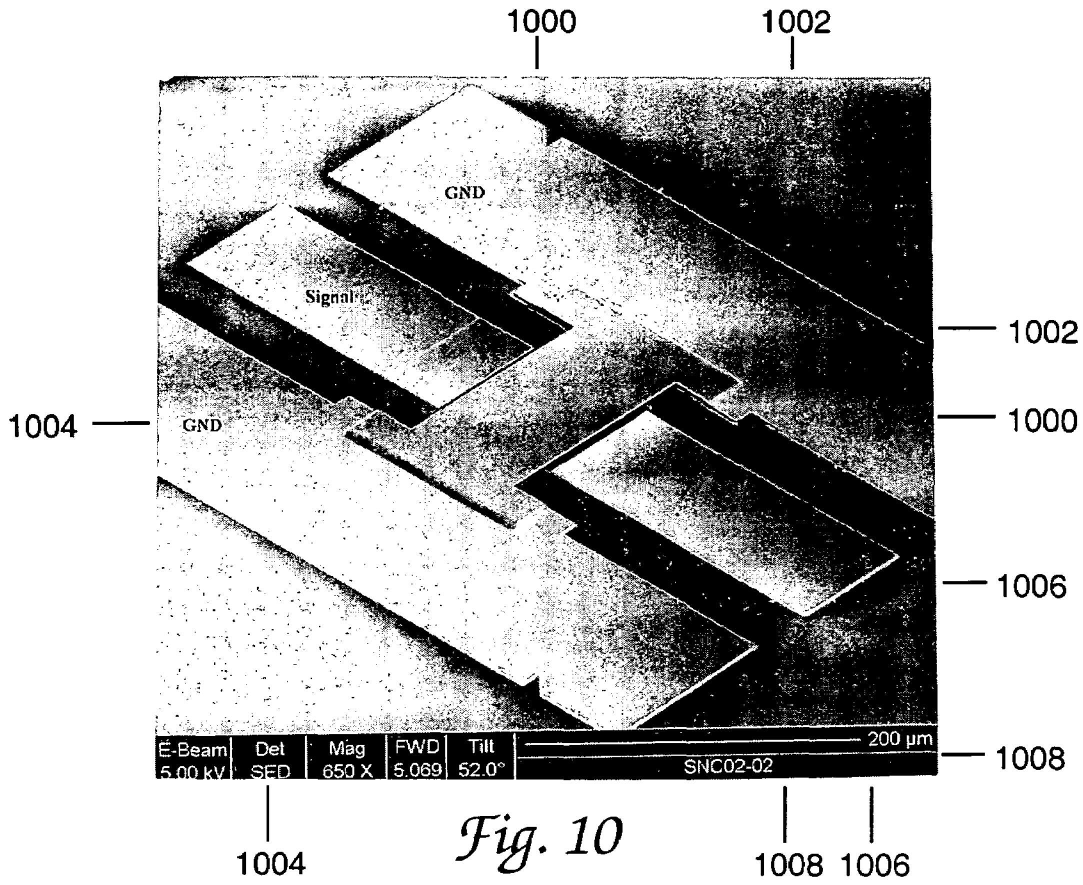
FIG. 10 in the drawings shows a present invention switch in unenclosed die condition.

Switch Operation:

MEMS radio frequency switches are typically fabricated in a coplanar waveguide configuration as shown in the scanning electron microscope-produced microphotograph of FIG. 10. In this FIG. 10 the bridge 1000 is anchored on the ground (GND) lines 1002 and 1004 and spans the center signal line 1006. By way of explanation, the FIG. 10 and several other of the microphotograph "drawings" herein originate in the form of mounted glossy photographic prints. In order to designate specific details in such "drawings", where drawn-in lead lines are impractical on the glossy photographic paper surface, the usual number and single lead line procedure is replaced with vertical and horizontal drawing coordinate lines each bearing the appropriate reference number and each located in a margin adjacent the glossy print surface. The two numbers 1000 relating to the FIG. 10 bridge structure provide an example of this arrangement in the FIG. 10 drawing. Additionally, the lower margin line at 1008 in FIG. 10 indicates the length of a 200 micrometer or 200 micron feature in the FIG. 10 photograph. Other details regarding scanning electron microscope variables used for the photograph also appear in the lower margin of FIG. 10 and each of the other microphotographs herein.

Operation of the FIG. 10 switch may be understood from a consideration of the FIG. 6L drawing. An RF signal is applied to the RF metal conductor 612 in FIG. 6L and passes into the switch area un-attenuated by the overarching bridge metal 614. To actuate the switch, a direct current (dc) voltage is superimposed on the RF signal, i.e. applied between the RF metal signal line 612 and the Bridge metal line 614. Electrostatic attraction pulls the bridge 614 into contact with the RF dielectric film 616 covering the RF metal signal line; the dielectric film 616 prevents an electrical short circuit between conductors 614 and 612. The resulting increased capacitance formed by the signal line 612, dielectric 616, and bridge 614 effectively shorts the RF signal between conductors 612 and 614. When the dc voltage is removed, the elastic restoring force of the structure pulls the bridge 614 up and allows the RF signal to pass. Transmission line conductors communicating radio frequency signals to and from the switch conductors 612 and 614 are represented at 618 and 620 respectively, these conductors extend into the page of the FIG. 6*j* drawing beyond the switch structure.

Process Demonstration:

The Fabrication Process described herein has been used in a class 100 clean room device fabrication facility. The following microphotograph-representing images describe graphically some of the results achieved while developing this fabrication process. Notably the fabrication process integrates RF MEMS switches with dielectric shells. The radio frequency test measurements included in these results show the presence of a dielectric shell does not degrade switch performance.

FIG. 11 in the drawings represents a scanning electron microscope micrograph showing a silicon nitride cap with the cylindrical holes at 804 in the FIG. 8B drawing appearing in the cap top. These holes are needed to remove the two sacrificial photoresist layers 508 and 312. The FIG. 11 nitride cap is disposed on a silicon substrate. The nitride cap brightness in the FIG. 11 image is due to the non-conductive nature of the material when viewed in an electron microscope. Note the crispness of the cap sidewalls in contacting the substrate surface and the slope of the cap in the region where the access holes are present. The FIG. 11 drawing additionally shows that the stress level in the silicon nitride film is well controlled (e.g. the cap is neither sagging nor buckled). Device dimensions and other details are shown along the lower edge of FIG. 11.

Figure 12:
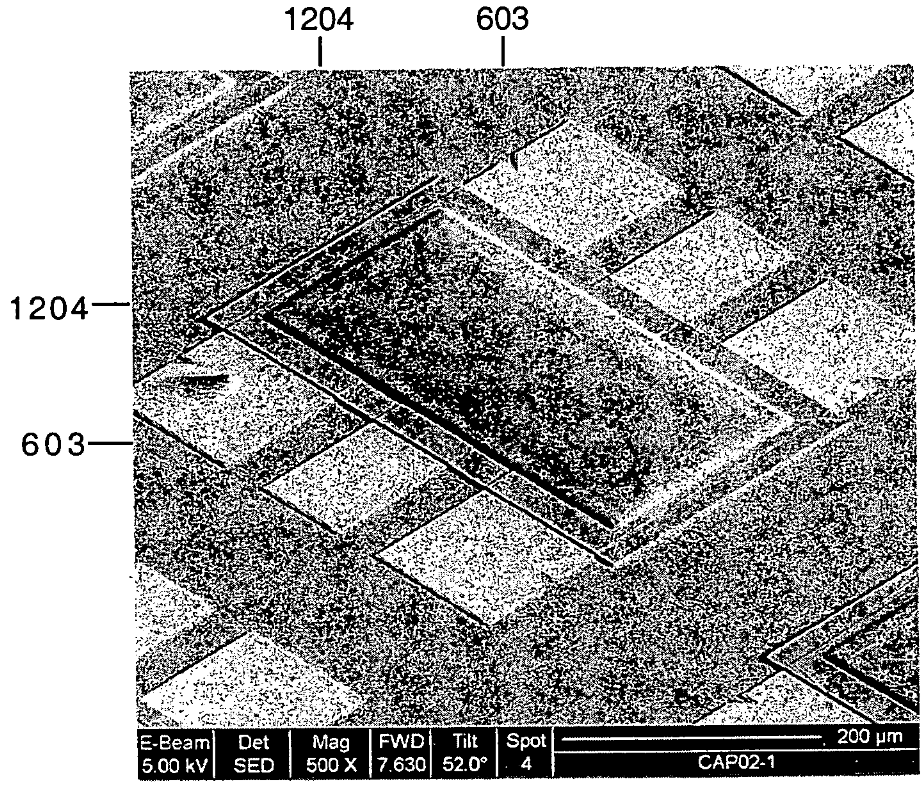
FIG. 12 in the drawings shows an enclosed MEMS switch according to the invention.

FIG. 12 in the drawings illustrates the cap 603 adhering to the ground and signal conductors and to the silicon substrate. The cap holes at 1204 are also clearly visible in FIG. 12. The FIG. 12 sample is flash coated with approximately 100 angstroms of gold for electron microscope viewing.

Figure 13:
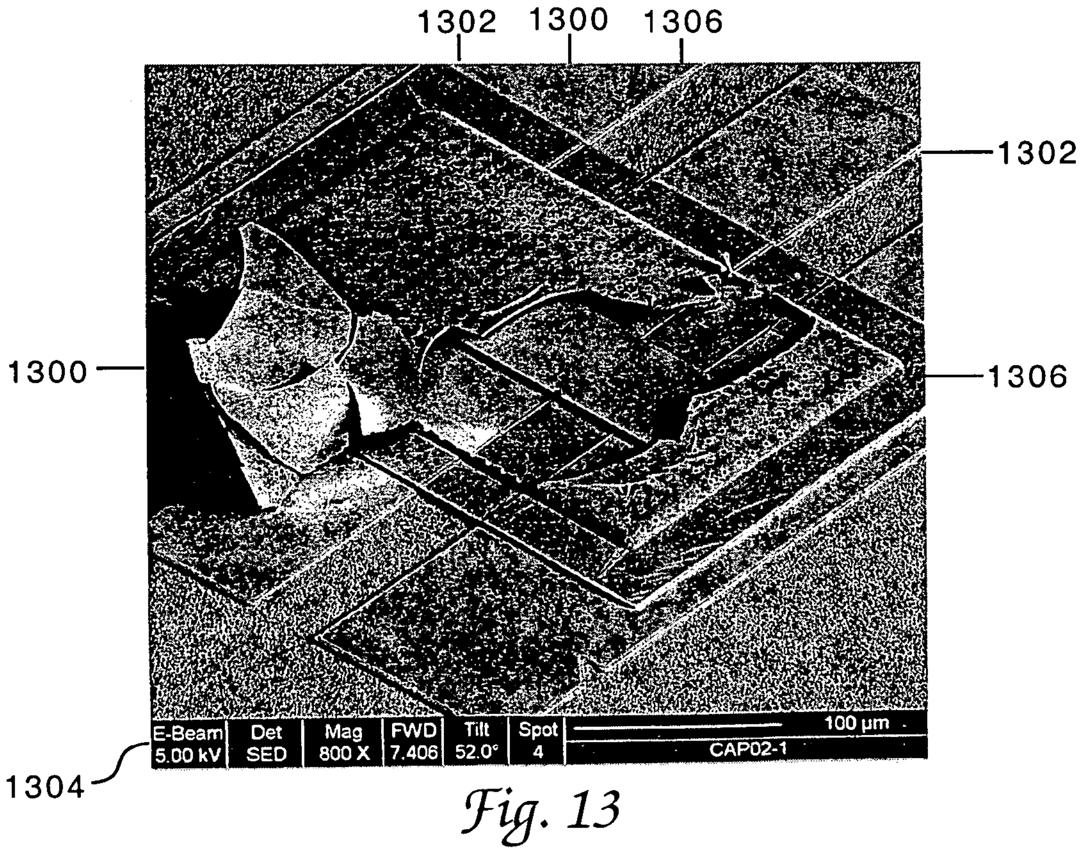
FIG. 13 in the drawings shows a switch of the FIG. 12 type in a ripped-open condition.

FIG. 13 in the drawings shows the FIG. 12 switch in a cut-away or torn-away condition. In this drawing the nitride cap is partially removed to reveal the switch underneath. The nick 1300 at the edge of the bridge structure is where an electrical probe tip was pushed into the bridge 1306 to verify switch integrity. Note that in addition to the gap between the MEMS switch bridge 1306 and the RF signal line 1304 and the substrate, a gap exists between the MEMS switch bridge 1306 and the normally located underside of the nitride cap 1302. The FIG. 13 sample is also flash coated with approximately 100 angstroms of gold for electron microscope viewing. Dimensions and other details also appear at the lower edge of FIG. 13.

FIG. 14 in the drawings shows a microphotograph including a switch that has been released from sacrificial layer captivity. In the FIG. 14 drawing there appears at 1400 and 1402 two metal conductors of the switch while at 1404 and 1406 the sapphire substrate is shown. Tunnel apertures for removal of sacrificial layer materials appear at 1408 in FIG. 14; these tunnels are shown in even better perspective in the scanning electron microscope view of the FIG. 15 microphotograph.

Figure 16:
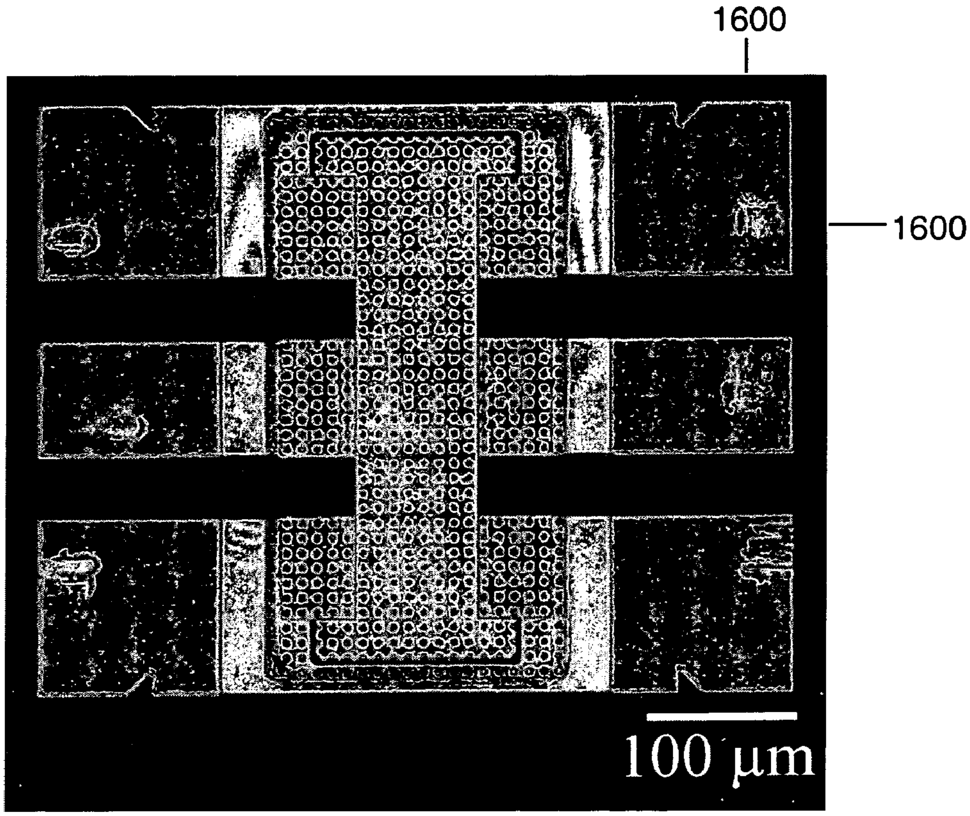
FIG. 16 in the drawings shows a MEMS switch with a silicon nitride cap in place.
Figure 17:
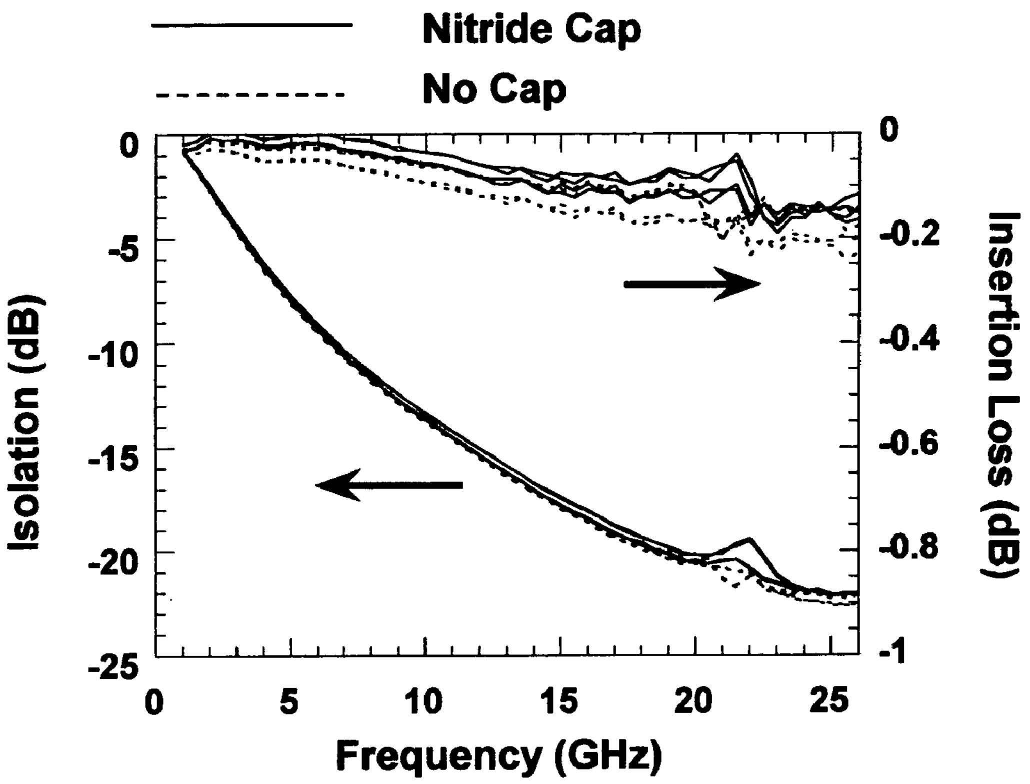
FIG. 17 in the drawings shows electrical performance of a capped switch according to the invention.

FIG. 16 in the drawings shows a microphotograph of a functional RF MEMS switch with a silicon nitride encapsulant on a sapphire substrate. RF probe marks as at 1600 appear on both sides of the ground and signal lines in FIG. 16. The result of RF test measurements made on the nitride capped devices and compared with switch performance measurements on non-capped capacitive RF MEMS switches are shown in the FIG. 17 drawing. These measurements indicate no loss in RF performance with the cap being present. In the FIG. 17 drawing the switch isolation of the lowermost curves relates to the left hand scale and switch insertion loss of the upper curves relate to the right hand scale. In the two FIG. 17 curves, the recited no measurable loss from switch cap presence is observed. Switch insertion loss in FIG. 17 is less than 0.3 dB (at 26 GHz) and isolation is greater than 20 dB (at 26 GHz).

Figure 18:
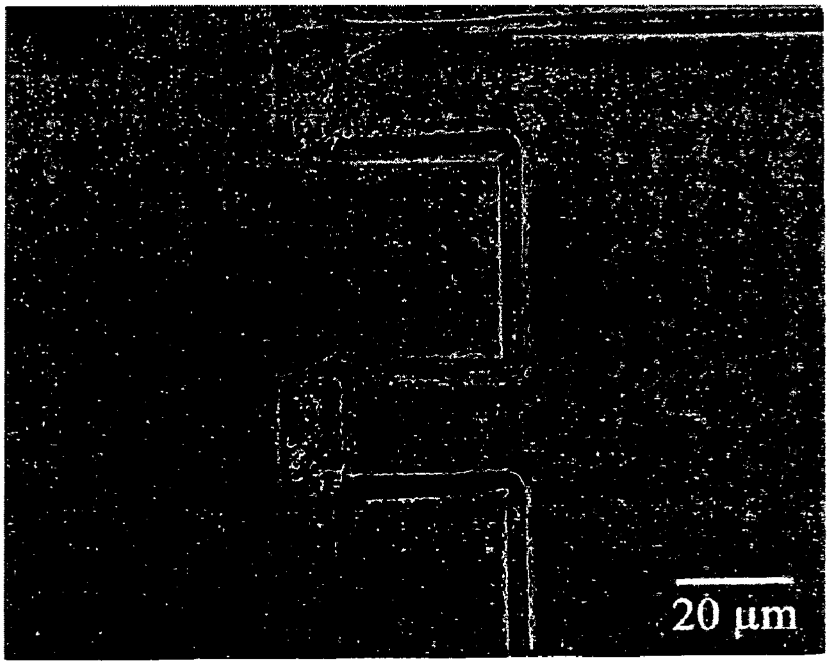
FIG. 18 in the drawings shows sealing of tunnels of the FIG. 15 type for the present invention.
Figure 20:
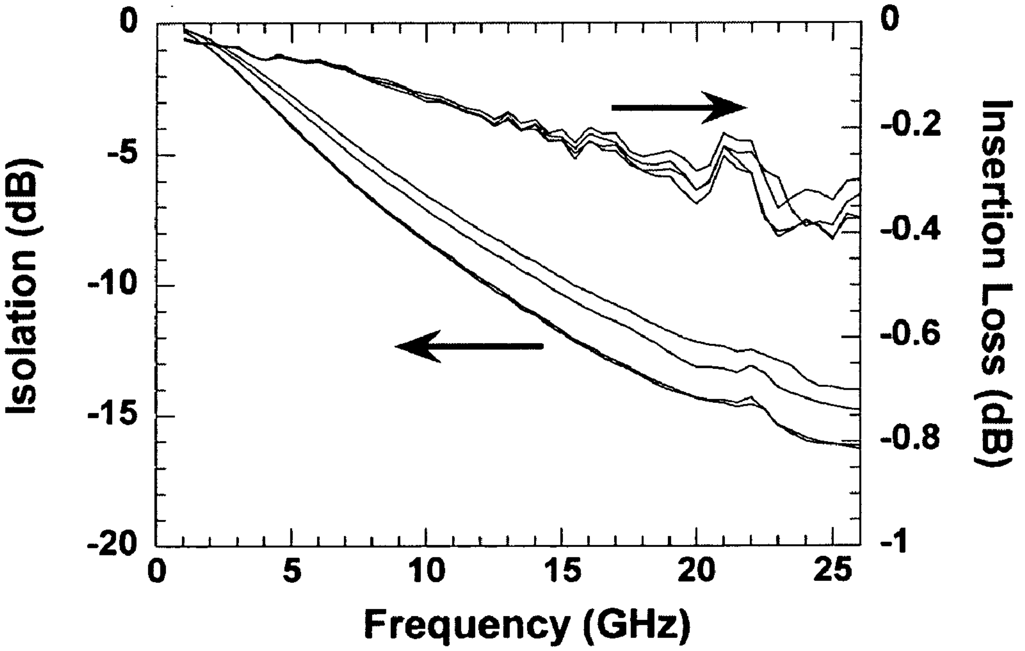
FIG. 20 in the drawings shows electrical performance for a capped and sealed switch according to the invention.
Figure 19:
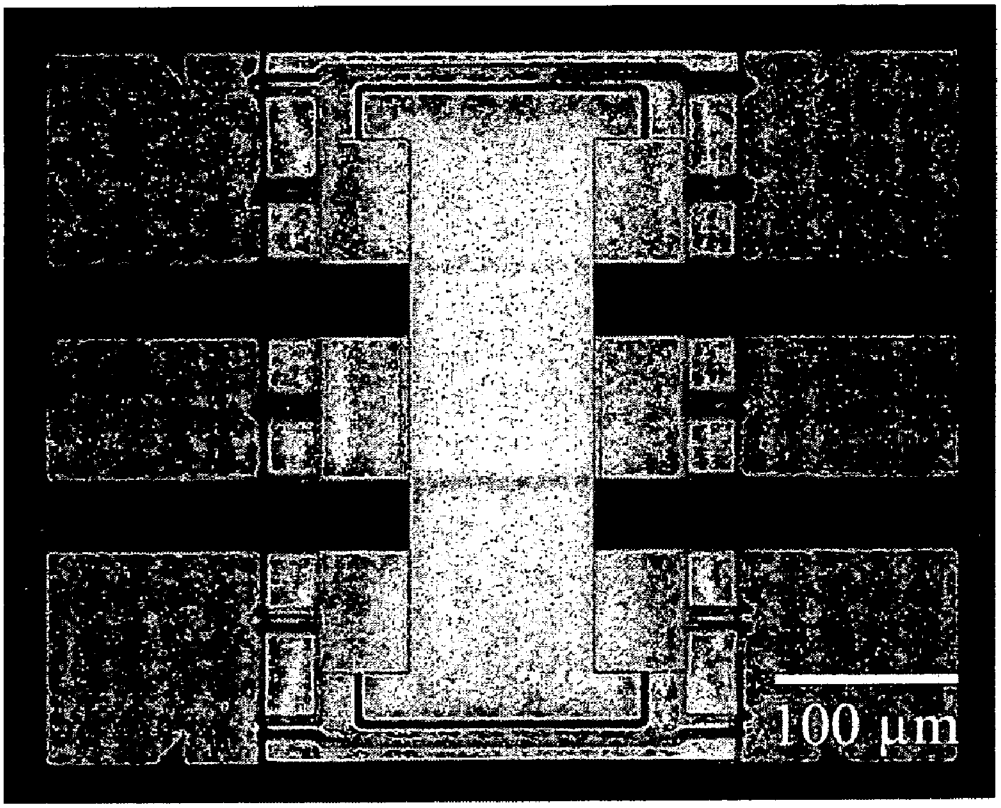
FIG. 19 in the drawings shows a PECVD sealed switch according to the invention.

Several methods may be used to seal the access holes or tunnels in the switch package of the present invention. The primary sealing approach using Plasma Enhanced Chemical Vapor Deposition (PECVD) achieves the sealing configuration shown in the FIG. 18 drawing where sealed access tunnels appear. Additional RF test measurements taken with PECVD sealed switches verify this sealing process also does not degrade switch performance. Test results for three sealed switches are shown in the FIG. 20 drawing where again both switch isolation and switch insertion loss are indicated. In the FIG. 20 drawing insertion loss is less than 0.3 dB (at 26 GHz) and isolation is 14–15 dB (at 26 GHz). FIG. 19 in the drawings shows a switch of the FIG. 16 type in an encapsulated and sealed condition. A dimension line in the lower right corner of FIG. 16 and FIG. 19 provides feature size indication.

Alternatives

Several alternatives in materials and processes may be employed in achieving the invention. These include the following:

Other high resistivity substrates, such as quartz, GaAs, or Si may be used.

Other materials may be used to seal the holes in the dielectric cap; materials such as Dow Corning Q1-4939 silicone; Honeywell Accuglass 512B; Electronic Materials Inc. OptoCast 3500 or 3600 series epoxies; Thermoset glob-top encapsulants; or solder shots.

A thin, stiff template similar to a shadow mask (such as made from stainless steel or other metal) could be made to include holes over the cap areas needing to be sealed. The template could be placed over the wafer containing the nitride caps and the sealing material, such as epoxy, could be flowed across the top of the caps with a squeegee or similar applicator.

A dry process can also be used to seal the access holes. Following an oven bake-out, a film is laminated over the encapsulated wafer and is heat cured. The sealed wafer is then patterned and the film removed from the contact pad areas.

A reflow process can also be used for access hole sealing. In this process, following an oven-bake out, glass or other frit beads are deposited on the wafer and reflowed to form a continuous film over the shells. The sealed wafer could then also be coated with photoresist, patterned, and etched to remove the glass film from the contact pad areas.

Once the RF MEMS switches are capped and access holes sealed additional process steps can be followed to hermetically seal the switch if required. For the case of the non-hermetic epoxy sealed cap, bake-out of the epoxy can be done in a controlled environment. A hermetic over-seal cap may then be placed on the individual switches as the next stage of the process. The individual devices can then be separated after wafer dicing and handled by conventional methods, such as by pick-and-place techniques. An attribute of the present invention is that it is multi-step in nature and allows for the possibility of hermetic sealing if needed.

Advantages and New Features

The present invention represents an integrated multi-step wafer-level process tailored to the fabrication and encapsulation of RF MEMS switches. The encapsulation arrangement is compatible with the switch fabrication process and utilizes the same sacrificial photoresist for both the device and dielectric shell. The sacrificial photoresist for the dielectric shell is cured at a lower temperature than the switch sacrificial layer to minimize secondary reflow of the switch sacrificial layer. The approach inherently protects the RF MEMS switch with sacrificial photoresist until the final process step when all the sacrificial photoresist is removed. Specifically, the dielectric encapsulant and RF MEMS devices are released simultaneously as a photoresist stripper penetrates cylindrical through-holes or tunnels patterned into the dielectric shell. A separate fabrication step seals the holes or tunnels in the dielectric shell to fully encapsulate each MEMS structure on the wafer. RF MEMS switches have been fabricated and released concurrently with a perforated silicon nitride shell covering them. The measured RF performance of suspended switches when tested up to 26 GHz does not show degradation due to the presence of the dielectric encapsulant.

The present invention involves a multi-step encapsulation method in which the shell is formed using a sputtered dielectric material such as silicon nitride or alumina. This shell has photo-lithographically defined access holes that are used to simultaneously release both the RF MEMS switch and the shell sacrificial photoresist. The access holes are sealed using silicon oxide or spin-on-glass or an epoxy layer. The resulting switches are sealed at atmospheric pressure or below atmospheric pressure and can thus provide sealed-in air for switch damping. In addition, the choice of photoresists and associated curing temperatures distinguish the present process.

The present invention concept is thus believed unique for the following reasons: (1) it allows for simultaneous release of both the MEMS switch and the dielectric encapsulating shell; (2) it provides options for sealing the dielectric shell access holes; (3) it is suitable for RF MEMS switch encapsulation, specifically the dielectric shell does not impede the RF performance of the devices; (4) the individual packaged switches can then be diced (or handled) and are suitable for further incorporation into an electronic circuit; (5) the sputtering technique used to deposit silicon nitride results in structurally sound cap shells; and (6) a multi-step concept has been demonstrated.

While the apparatus and method herein described constitute a preferred embodiment of the invention, it is to be understood that the invention is not limited to this precise form of apparatus or method and that changes may be made therein without departing from the scope of the invention, which is defined in the appended claims.

We claim:

1. The partially fabricated low temperature organic photoresist materials-achieved MEMS switch comprising:

a plurality of metallic switch elements held captive in melded multiple thin reflow rounding shaped sacrificial layers of said organic photoresist coating materials on an insulting substrate member;

a dielectric shell enclosure surrounding said metallic switch elements and said melded multiple thin reflow rounding shaped-sacrificial layers on said insulating substrate member;

a radio frequency transmission line having lengthwise portions extending outside of and inside of said dielectric shell enclosure and including electrical connection with selected of said metallic switch elements inside of said dielectric shell enclosure;

a plurality of dielectric shell enclosure-traversing aperture paths communicating from outside to inside of said dielectric shell enclosure; and a wet photoresist consuming reactant material received within said dielectric shell enclosure through said plurality of dielectric shell enclosure-traversing aperture paths communicating from outside to inside thereof to release said metallic switch elements from said captivity.

2. The partially fabricated low temperature organic photoresist materials-achieved MEMS switch of claim 1 further including:

a coating material of fabrication temperature compatibility with said switch elements and with said dielectric shell enclosure and covering said plurality of apertures communicating from outside to inside of said dielectric shell;

said coating material being added to said MEMS switch after removal of said selected sacrificial of said organic photoresist coating materials and said wet photoresist consuming reactant material.

3. The partially fabricated low temperature organic photoresist materials-achieved MEMS switch of claim 2 wherein said coating material of fabrication temperature compatibility with said switch elements and with said dielectric shell enclosure is consisting of one of silicon oxide, spun-on glass and epoxy materials.

4. The partially fabricated low temperature organic photoresist materials-achieved MEMS switch of claim 1 wherein said dielectric shell enclosure is comprised of silicon nitride material.

5. The partially fabricated low temperature organic photoresist materials-achieved MEMS switch of claim 1 wherein said wet photoresist consuming reactant material is a heated photoresist stripping agent.

6. The partially fabricated low temperature organic photoresist materials-achieved MEMS switch of claim 1 wherein said melded multiple thin reflow rounding shaped sacrificial layers of said organic photoresist coating materials are three in number.

7. The partially fabricated low temperature organic photoresist materials-achieved MEMS switch of claim 3 further including an adhesion layer of alumina located intermediate said coating material of fabrication temperature compatibility with said witch elements and said dielectric shell enclosure.

8. A wafer of oxide and nitride materials inclusive, low temperature photoresist processing based, hermetically sealable, transmission line fed, capacitance coupled, radio frequeny MEMS switch die comprising the combination of:

a plurality of static metallic elements of said transmission line and switch received in each die of in insulating substrate wafer member;

an electrical insulating switch-closed capacitance determining coating over selected of said operationally static metallic elements of said transmission line and switch in each said die;

said switch-closed capacitance determining coating consisting of one of aluminum oxide, silicon nitride and silicon oxide materials;

a first fused multiple layers sacrificial photoresist coating covering selected portions of said insulating substrate member and electrical insulating coated operationally static metallic elements in each said die;

a shaped thin metal film movable switch element received on a top surface of said first sacrificial photoresist layer coating in each said die;

an adhesion promoting thin layer of different metal covering an external surface portion of said thin metal film movable switch element;

a second sacrificial photoresist layer coating covering selected portions of said shaped thin metal film movable switch element, said first sacrificial photoresist layer coating and said insulating substrate member and electrical insulation coated operationally static metallic elements in each said die;

a silicon nitride shell member laterally surrounding and covering said second sacrificial photoresist layer coating on said insulating substrate member in each said die;

a plurality of apertures received in said silicon nitride shell member and communicating from within to external of said dielectric shell member in each said die;

an adhesion promoting thin layer of alumina covering an external surface portion of said silicon nitride shell member in each said die;

an aperture closing film of silicon dioxide covering said shell member adhesion promoting alumina layer in each said die; and a sacrificial photoresist layer-consuming liquid reagent communicating via said silicon nitride shell member plurality of apertures from outside to inside of said shell member in each said die.

9. The wafer of oxide and nitride materials inclusive, low temperature photoresist processing based, hermetically sealable, transmission line fed, capacitance coupled, radio frequency MEMS switch die of claim 8 further including an enclosing layer of protecting and sealing material covering said silicon nitride shell member and said plurality of apertures.

10. The wafer of oxide and nitride materials inclusive, low temperature photoresist processing based, hermetically sealable, transmission line fed, capacitance coupled, radio frequency MEMS switch die of claim 8 wherein said first and second sacrificial photoresist layer coatings are each comprised of a plurality of heat fused sub layers of photoresist.

11. The partially fabricated low temperature organic photoresist materials-achieved MEMS switch of claim 3 further including first and second of said melded multiple thin reflow rounding shaped sacrificial layers of said organic photoresist coating materials, one covering each of said metallic switch elements.

12. A metallic movable member MEMS switch comprising.

a fixed position first metallic switch element received on an insulating switch substrate member;

a movement configured second metallic switch element connected with said insulating switch substrate member and covering said fixed position first metallic switch element;

a first dielectric material shell enclosure surrounding said metallic switch elements and attached to said insulating switch substrate member;

said dielectric material shell enclosure including a plurality of dispersed shell traversing apertures communicating between interior and exterior regions thereof;

an aperture-sealing second dielectric material coating, differing from said first dielectric material, and covering said dielectric shell and said plurality of dispersed shell traversing apertures; and a thin layer of adhesion promoting material lying intermediate an exterior surface of said first dielectric material shell enclosure and an interior surface of said aperture-sealing second dielectric material coating.

13. The metallic movable member MEMS switch of claim 12 wherein said aperture-sealing second dielectric material coating is comprised of multiple temperature level-cured spun-on glass.

14. The metallic movable member MEMS switch of claim 12 wherein:

said switch is surrounded by a substrate received dam member;

said aperture-sealing second dielectric material coating is comprised of epoxy material initially confined within said dam member.

15. The partially fabricated sacrificial organic photoresist material-achieved metallic movable member MEMS switch comprising:

a fixed position first metallic switch element held captive on an insulating switch substrate member;

a reflow tapered multiple layered first coating of sacrificial organic photoresist material overlying said first metallic switch element;

a second metallic switch element connected with said insulating switch substrate member and received on said reflow tapered multiple layered first coating of sacrificial organic photoresist material;

said reflow tapered multiple layered first coating of sacrificial organic photoresist material lying intermediate said fixed position first metallic switch element and said second metallic switch element ad holding said switch elements in fixed relative position captivity;

a reflow tapered multiple layered second coating of sacrificial organic photoresist material overlying said second metallic switch element and said multiple layered first coating of sacrificial organic photoresist material;

a dielectric shell enclosure surrounding said metallic switch elements and said first and second multiple layered coatings of sacrificial organic photoresist material and also connecting with said insulating switch substrate member;

a thin layer of adhesion promoting material lying intermediate connecting portions of said dielectric shell enclosure and said insulating switch substrate member.

16. The partially fabricated sacrificial organic photoresist materials-achieved metallic movable member MEMS switch of claim 15 wherein said dielectric shell enclosure includes a plurality of shell traversing apertures sealed with a differing dielectric material coating and wherein said adhesion promoting material is comprised of alumina.

17. The partially fabricated low temperature sacrificial organic photoresist materials-achieved metallic movable member MEMS switch comprising:

a radio frequency transmission line connected fixed position metallic switch element received on a switch insulating substrate member;

a movement configured metallic switch element overlying said fixe position metallic switch element on said insulating substrate member;

a melded sub layers first coating of said sacrificial photoresist material lying intermediate said fixed position metallic switch element and said movable metallic switch element;

a melded sub layers second coating of said sacrificial photoresist material overlying said movement cold metallic switch element;

a dielectric shell enclosure surrounding said metallic switch elements on said insulating substrate member, a radio frequency transmission line having lengthwise portions extending outside of and inside of said dielectric shell enclosure and including electrical connection with selected of said metallic switch elements inside of said dielectric shell enclosure;

a plurality of dielectric shell enclosure-traversing aperture paths communicating from outside to inside of said dielectric shell enclosure; and a wet photoresist consuming reactant material received within said dielectric shell enclosure through said plurality of dielectric shell enclosure-traversing aperture paths communicating from outside to inside thereof to release said metallic switch elements from said melded multiple sub layers photoresist coatings.

18. The partially fabricated low temperature organic photoresist materials-achieved HEMS switch of claim 17 wherein said melded sub layers first coating and said melded sub layers second coating sacrificial photoresist materials are comprised of three melded sub layers each.

19. The partially fabricated low temperature organic photoresist materials-achieved MEMS switch of claim 17 her including a permanent layer of inorganic dielectric material received on said transmission line connected fixed position metallic switch element under said melded sub layers first coating of said sacrificial photoresist material.

* * * * *

CERTIFICATE OF CORRECTION

PATENT NO. : 7,145,213 B1
APPLICATION NO. : 10/901314
DATED : December 5, 2006
INVENTOR(S) : John L. Ebel et al.

It is certified that error appears in the above-identified patent and that said Letters Patent is hereby corrected as shown below:

On the Title page, Item (54)
"MEMS RF SWITCH INTEGRATED PROCESS" should read --"MEMS RF SWITCH"--.

Title page, Item (57)
The ABSTRACT should read

--ABSTRACT
A capacitance coupled, transmission line fed, radio frequency MEMS switch apparatus achievable with low temperature photoresist based wafer scale processing steps is described. The switch apparatus is disposed in a low cost dielectric housing free of undesired electrical effects on the switch and on the transmission line(s) coupling the switch to an electrical circuit. The dielectric housing is provided with an array of sealable apertures useful for wet, but hydrofluoric acid-free, removal of switch fabrication-employed materials and also useful during processing for controlling the operating atmosphere surrounding the switch-e.g., at a pressure above the high vacuum level for enhanced and selectable switch damping during operation. Alternative sealing arrangements for the array of dielectric housing apertures are included. Processing details including plan and profile drawing views, specific equipment and materials identifications, temperatures and times are included. The MEMS switch may also be of the metal contact type.--.

Column 1, line 1
Title "MEMS RF SWITCH INTEGRATED PROCESS" should read --MEMS RF SWITCH--.

Column 2, line 47 through Column 4, line 36
The SUMMARY OF THE INVENTION section should read --The present invention provides a wafer-scale achieved RF MEMS switch. Packaging of the switch is directly integrated into the surface micromachining process used to build the switch device. The switch is disclosed by way of a capacitance change operated switch device however the invention is considered applicable to both capacitive and metal-to-metal contact switches.

an electrical insulating switch-closed spacing determining coating over selected of said operationally static metallic elements of said transmission line and switch;

UNITED STATES PATENT AND TRADEMARK OFFICE

CERTIFICATE OF CORRECTION

PATENT NO. : 7,145,213 B1 
APPLICATION NO. : 10/901314
DATED : December 5, 2006
INVENTOR(S) : John L. Ebel et al.

It is certified that error appears in the above-identified patent and that said Letters Patent is hereby corrected as shown below:

a first removable sacrificial layer coating covering selected portions of said insulating substrate member and electrical insulating coated operationally static metallic elements;

a bridge shaped metal film electrically controllable element of said MEMS switch received on said first removable sacrificial layer coating;

a second removable sacrificial layer coating covering said bridge shaped electrically controllable element of said MEMS switch, said electrical insulating switch-closed spacing determining coating and said operationally static metallic elements of said transmission line and switch;

a dielectric shell member laterally surrounding and covering said switch elements and said sacrificial layers on said insulating substrate member;

a plurality of apertures received in said dielectric shell member and communicating from within to external of said dielectric shell member;

said transmission line also including metal electrical conductor portions communicating from within to external of said dielectric shell member; and a sacrificial layer-consuming liquid reagent communicating via said dielectric shell member plurality of apertures from outside to inside of said shell member.--.

Signed and Sealed this

Twenty-second Day of December, 2009

David J. Kappos

David J. Kappos
*Director of the United States Patent and Trademark Office*